(12) United States Patent
Hennerdal et al.

(10) Patent No.: US 7,736,489 B2
(45) Date of Patent: Jun. 15, 2010

(54) PROCESS RELATING TO POLYMERS

(75) Inventors: Lars-Olov Hennerdal, Örebro (SE); Tommi Remonen, Nyköping (SE); Jessica Häll, Norrköping (SE); Anna Malmström, Norrköping (SE); Magnus Berggren, Vreta Kloster (SE); Thomas Kugler, Cambridge (GB); Luc Leenders, Herentals (BE); Johan Lamotte, Rotselaar (BE)

(73) Assignee: Acreo AB, Kista (SE)

( * ) Notice: Subject to any disclaimer, the term of this patent is extended or adjusted under 35 U.S.C. 154(b) by 1159 days.

(21) Appl. No.: 10/487,575

(22) PCT Filed: Sep. 13, 2002

(86) PCT No.: PCT/SE02/01663

§ 371 (c)(1),
(2), (4) Date: May 7, 2004

(87) PCT Pub. No.: WO03/025953

PCT Pub. Date: Mar. 27, 2003

(65) Prior Publication Data

US 2004/0188656 A1    Sep. 30, 2004

(30) Foreign Application Priority Data

Sep. 14, 2001  (SE)  .................................. 0103047

(51) Int. Cl.
*H01B 1/00*   (2006.01)
(52) U.S. Cl. .................... 205/687; 252/519.2; 252/500; 205/790.5; 428/195.1; 428/336
(58) Field of Classification Search ............. 205/790.5; 428/336, 195.1; 252/519.2; 401/151
See application file for complete search history.

(56) References Cited

U.S. PATENT DOCUMENTS

| | | | | |
|---|---|---|---|---|
| 3,753,174 A | * | 8/1973 | Miller | 399/246 |
| 4,168,212 A | * | 9/1979 | Faktor et al. | 205/790.5 |
| 4,620,943 A | * | 11/1986 | Denisevich et al. | 252/519.2 |
| 4,849,286 A | * | 7/1989 | Milne | 428/336 |
| 4,872,962 A | * | 10/1989 | Scheer et al. | 204/224 R |

(Continued)

FOREIGN PATENT DOCUMENTS

EP     1 054 414    11/2000

(Continued)

OTHER PUBLICATIONS

Dietrich et al. "Electrochemical and spectroscopic characterization of polyalkylenediocythiophenes," Institut für Physikallsche Chante der Universität F. . . .

*Primary Examiner*—Mark F Huff
*Assistant Examiner*—Rashid Alam
(74) *Attorney, Agent, or Firm*—Harness, Dickey & Pierce, P.L.C.

(57) ABSTRACT

A process for rendering an electrically conducting polymer essentially non-conducting is provided, in which the polymer is brought into direct electrical contact with an electrolyte. Furthermore, an electric voltage is applied to the polymer using at least two electrodes connected to a voltage supply, each electrode independently being in electrical contact with one of the polymer and the electrolyte. The electrically conducting polymer is rendered non-conducting through electrochemical reactions occurring in the interface between the polymer and the electrolyte in response to the electric voltage.

33 Claims, 14 Drawing Sheets

U.S. PATENT DOCUMENTS

| | | | |
|---|---|---|---|
| 5,023,129 A | * | 6/1991 | Morganti et al. ......... 428/195.1 |
| 5,080,470 A | * | 1/1992 | Warszawski ................ 359/265 |
| 5,262,797 A | * | 11/1993 | Boeller et al. ................. 346/25 |
| 5,336,007 A | * | 8/1994 | Jozat .......................... 401/151 |
| 5,492,611 A | * | 2/1996 | Sugama et al. ......... 204/403.06 |
| 5,561,030 A | | 10/1996 | Holdcroft et al. |
| 6,241,913 B1 | * | 6/2001 | Angelopoulos et al. ..... 252/500 |
| 6,890,363 B1 | * | 5/2005 | Sakai et al. ................ 29/25.03 |
| 2001/0015441 A1 | * | 8/2001 | Kawasaki et al. ............. 257/66 |

FOREIGN PATENT DOCUMENTS

| | | |
|---|---|---|
| EP | 1 054 414 A1 | 11/2000 |
| EP | 1 079 397 | 2/2001 |
| EP | 1 436 818 B1 | 6/2007 |
| WO | WO 97/18944 | 5/1997 |

* cited by examiner

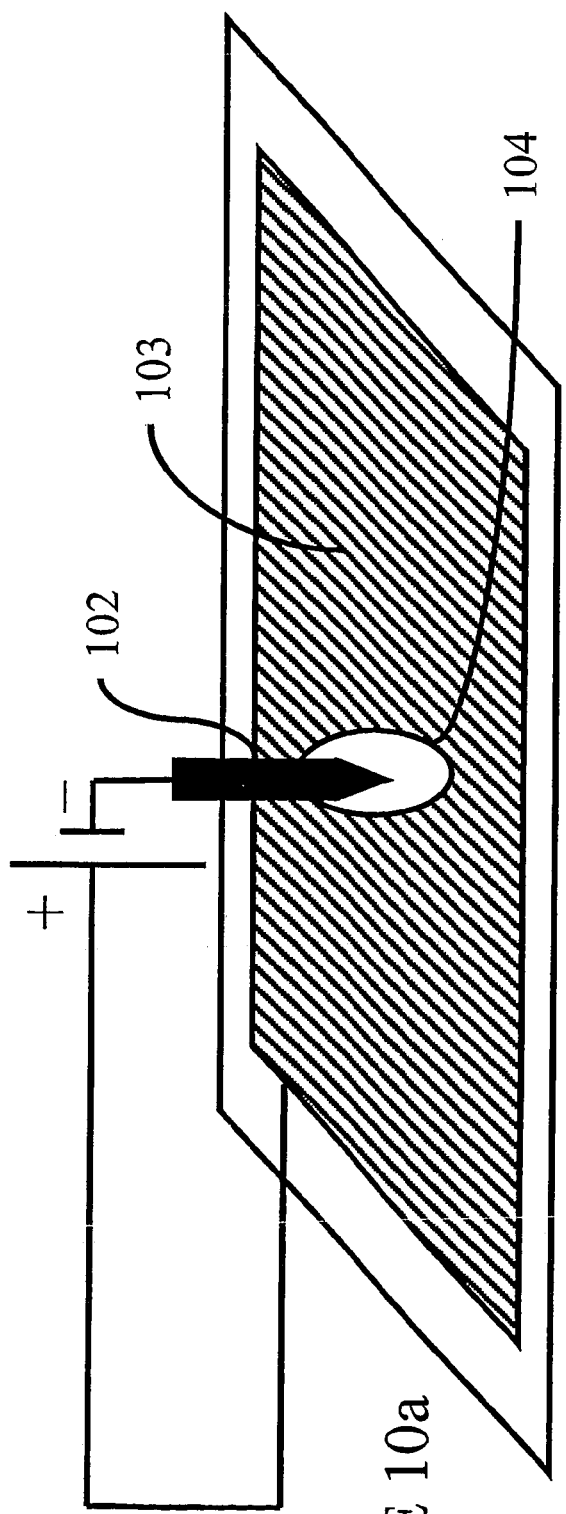
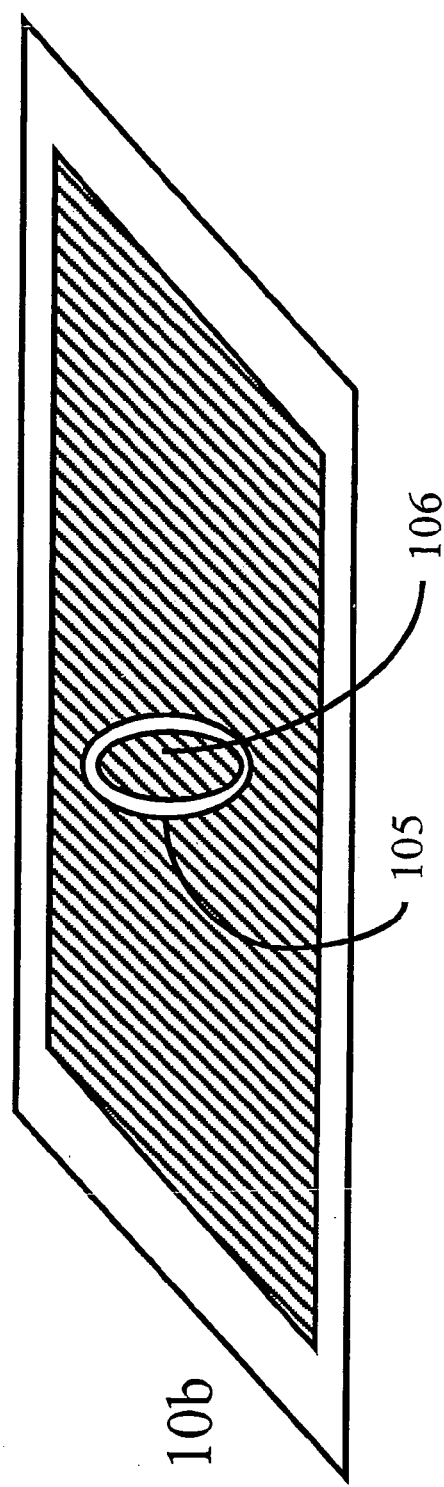

PROCESS RELATING TO POLYMERS

FIELD OF INVENTION

The present invention relates to a process for patterning of electrically conducting polymers through deactivation thereof. In particular, it relates to a process for rendering electrically conducting polymers non-conducting through electrochemical reactions.

BACKGROUND OF THE INVENTION

Electrically conducting polymers and other electronically functionalised materials are key components for the development of polymer electronics. However, the realisation of novel polymer electronic components is dependent on technology for realisation and assembling of patterns of such materials on a large number of different substrates. Patterns of electrically conducting polymers can be achieved in different ways. Either the electrically conducting polymer is deposited in a defined pattern on the substrate, or a sheet, layer or film of electrically conducting polymer is deposited, which is subsequently patterned using subtractive techniques or local deactivation. In the case of electrically conducting polymers, such deactivation may be achieved through a substantial decrease in, or complete elimination of, conductivity in the material. Thus, for example, a film of an electrically conducting polymer material may be patterned through rendering certain parts, sections, segments, lines etc non-conducting.

Known methods of achieving desired deactivation of polymer materials on substrates include exposing the materials to strongly oxidising, wet chemical agents, such as aqueous solutions of sodium hypochlorite or potassium permanganate. These solutions can be applied locally using printing techniques like ink-jet, screen, offset, flexographic etc. Known methods like these are described e g by Agfa-Gaevert N.V., Specialty Foils and Components, in product documentation relating to patterning of Orgacon™ films using Strupas ink (available on the world wide web at the time of filing on http://sfc.agfa.com/pdf/PatterningStrupas.pdf). However, such known methods suffer from a number of drawbacks, which limit their applicability and usefulness. The solutions used are highly oxidising, and therefore strongly corrosive to any equipment involved. In addition, chlorine containing reagents are harmful to the environment. Furthermore, the fact that the wet chemical reagents diffuse laterally through the material that is to be patterned results in a poor maximum resolution of the pattern.

An alternative method in the prior art for patterning polymers is the use of photolithography in combination with photoresist overlayers for realising of patterns with high resolution (i e on the micrometer scale) by exposing of the polymer to an oxygen and fluorine containing plasma. Known methods like these are described in e g Lowe J, Bartels C, Holdcroft S, Canadian Journal of Chemistry, vol 76(1998), 1524-9; Jager EWH, Smela E, Inganas O, Science, vol 290 (2000), 1540-5; Chinn D, Janata J, Thin Solid Films, vol 252(1994), 145-51. These methods, too, have disadvantages, considering that plasma processes require vacuum equipment, and that the use of photoresists requires the manufacture of new photolithography masks whenever the desired pattern is modified.

Thus, there is a demand in the art for methods for the patterning of polymer materials that improve the art and do not suffer the disadvantages of known methods.

SUMMARY OF THE INVENTION

An object of the present invention is to meet this demand, by providing a process for the deactivation of electrically conducting polymers, in which process the electrically conducting polymer is rendered essentially non-conducting in a safe, fast, cheap and simple manner.

Another object of the present invention is the provision of a process relying on electrochemical reactions that occur in response to the application of a voltage to the electrically conducting polymer.

A further object of the invention is to enable safe and simple patterning, through deactivation, of polymer films with a high resolution.

The above-mentioned and other objects are realised by the process according to the present invention. Thus, a process for rendering an electrically conducting polymer essentially non-conducting is provided, in which process the polymer is brought into direct electrical contact with an electrolyte, an electric voltage is applied to said polymer using at least two electrodes connected to a voltage supply, each electrode independently being in electrical contact with one of said polymer and said electrolyte, and said electrically conducting polymer is rendered essentially non-conducting through electrochemical reactions occurring in the interface between said polymer and said electrolyte in response to said electric voltage.

The process according to the invention is advantageous in that it relies solely on electrochemical reactions between a polymer and an electrolyte in response to an electric voltage. This obviates the need for any strongly oxidising and potentially harmful reagents. Furthermore, the electrochemical reactions that deactivate the polymer are confined to within the area of contact between electrolyte and polymer, and will only occur when an electric voltage is applied. The size of the area in which the electrochemical reactions occur can be chosen freely, making possible the realisation of deactivation patterns of very high resolution. The electrolyte in the present invention does not in itself destroy the conductivity of the polymer, so no deleterious effects on pattern resolution resulting from diffusion of the electrolyte in the polymer are expected. In contrast, oxidising wet chemicals of prior art methods diffuse through the polymer material, making high-resolution patterning impossible. The process according to the invention offers a safe, fast, cheap and simple alternative to photolithographic plasma processes for the realisation of high-resolution patterns.

BRIEF DESCRIPTION OF THE DRAWINGS

FIG. 10 is a schematic view of an embodiment of the invention, using conducting electrolyte.

DETAILED DESCRIPTION OF THE INVENTION

The process of the present invention comprises bringing an electrically conducting polymer in contact with an electrolyte, and applying an electric voltage in such a way as to cause electrochemical reactions within the area of contact between polymer and electrolyte. This is achieved through the use of at least two electrodes connected to a voltage supply. Depending on the set-up used, there are alternative ways that the electrodes may supply the voltage needed for the electrochemical reactions: (i) both electrodes are in direct electrical contact with the polymer; (ii) one electrode is in direct electrical contact with the polymer whereas the other is in direct electrical contact with the electrolyte; or (iii) both electrodes are in direct electrical contact with the same electrolyte or different electrolytes. In the case of more than two electrodes, any combination of electrodes contacting the polymer and electrodes contacting electrolytes falls within the scope of the present invention.

In a preferred embodiment, the electrically conducting polymer is present in the form of a film, layer or sheet. The use of such a film to manufacture a component of an electronic device, such as an electrochromic display or a component of an electric circuit, depends on the possibility to realise patterns in the film. Thus, in a preferred embodiment of the invention, a film of an electrically conducting polymer is rendered partially non-conducting, so that certain areas of the film are deactivated by the inventive process while other areas remain active (i e electrically conducting). It is especially preferred that this deactivation is performed in accordance with a predetermined pattern, such as a circuit pattern or a pattern corresponding to different graphical elements of a display device.

For such localised deactivation of electrically conducting polymer, it is necessary to confine the region in which electrochemical reactions occur in response to the applied voltage to the positions on the film where the electrically conducting polymer is to be rendered non-conducting only. This can be achieved using one of several different approaches, which will now be described with reference to the accompanying schematic drawings.

Figure 1:
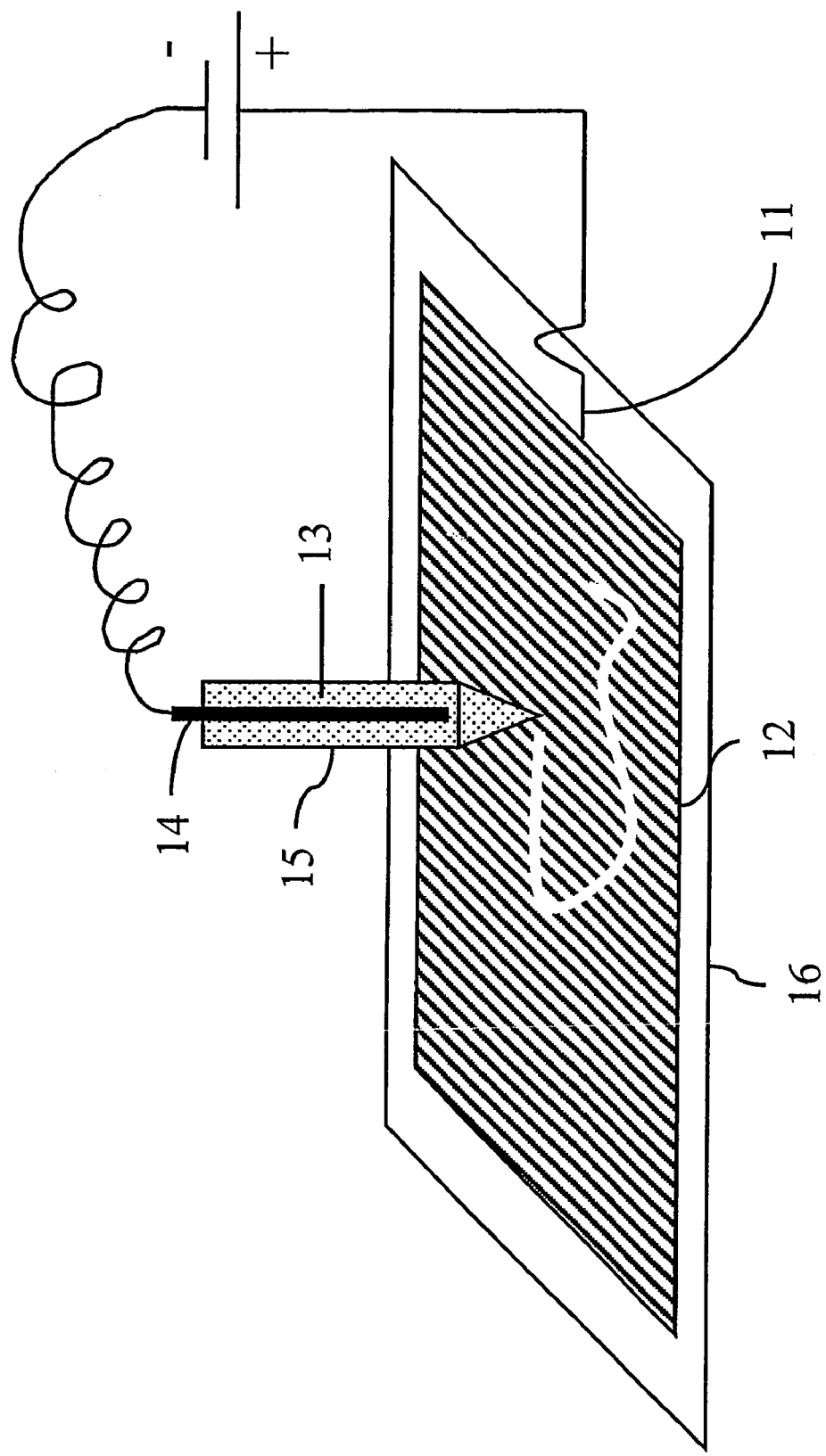
FIG. 1 is a schematic view of an electrically conducting polymer on a substrate, which is rendered locally non-conducting through the action of a plotter pen adapted to contain electrolyte and an electrode, in accordance with an embodiment of the invention. The edge of the electrically conducting polymer is connected to a voltage supply.

In one embodiment of the invention, using the set-up according to FIG. 1, a first electrode 11 is in direct electrical contact with a film of a conducting polymer 12. The electrolyte 13 and a second electrode 14 are confined inside a container 15, which is provided with an opening through which the electrolyte may come into contact with the electrically conducting polymer. The arrangement of electrolyte 13 and electrode 14 is such that the electrode is in direct electrical contact with the electrolyte. The container may be moved across the film in a desired manner. The contact of electrolyte with polymer may be upheld, and deactivation of the polymer controlled by the selective application of voltage between the electrodes when the electrolyte is in contact with polymer areas that are to be rendered non-conducting. Alternatively, the voltage may be kept constant, and the electrolyte brought into contact with the polymer at such areas where deactivation should occur, by lifting and lowering of the container as it is moved across the polymer film. Typically, such a container is arranged as a depositing means. Especially preferred is the use of a cylindrical and pointed depositing means, such as a reservoir pen, said opening then suitably being located at the tip of the point of the pen, or a felt tip pen, said opening then corresponding to the felt tip of the pen soaked in the electrolyte. The cross-sectional area of the opening in said depositing means is typically between 100 µm and 5 cm, and may be chosen depending on the desired resolution of the intended pattern.

For the purposes of convenient and exact control of what positions of the polymer film are rendered non-conducting, it is furthermore preferred to use such a depositing means in conjunction with standard plotting equipment (not shown). The pen of a conventional plotter may be adapted to contain the electrolyte instead of conventional ink, and the second electrode may easily be realised, for example as a copper wire inserted in the reservoir filled with electrolyte. In a preferred embodiment of the present invention, the film of electrically conducting polymer is placed on a flat support 16, which may be made from a flexible material, and connected to the first electrode. A plotter tool comprising a pen adapted as described above is arranged in such a way that the tip of the plotter pen contacts the polymer, thus bringing electrolyte in contact with polymer at the tip of the pen only. The position of the plotter pen may suitably be controlled by a personal computer connected to the plotting equipment. Such a personal computer may furthermore advantageously comprise graphics software, which allows the virtual design of patterns. These patterns may subsequently be transferred to the polymer film through the controlled movement of the plotter pen over the electrically conducting polymer film, and the concomitant application of an electric voltage between the first and second electrodes. When a felt-tip pen of a conventional plotting tool is used in this fashion, the resolution of the pattern is typically of the order of 1 mm. In the general case, the resolution obtained depends largely on the cross-sectional area of the opening in the depositing means used. Thus, in accordance with what is stated above regarding the dimensions of this opening, a resolution of from 100 μm up to 5 cm can be obtained.

Figure 2:
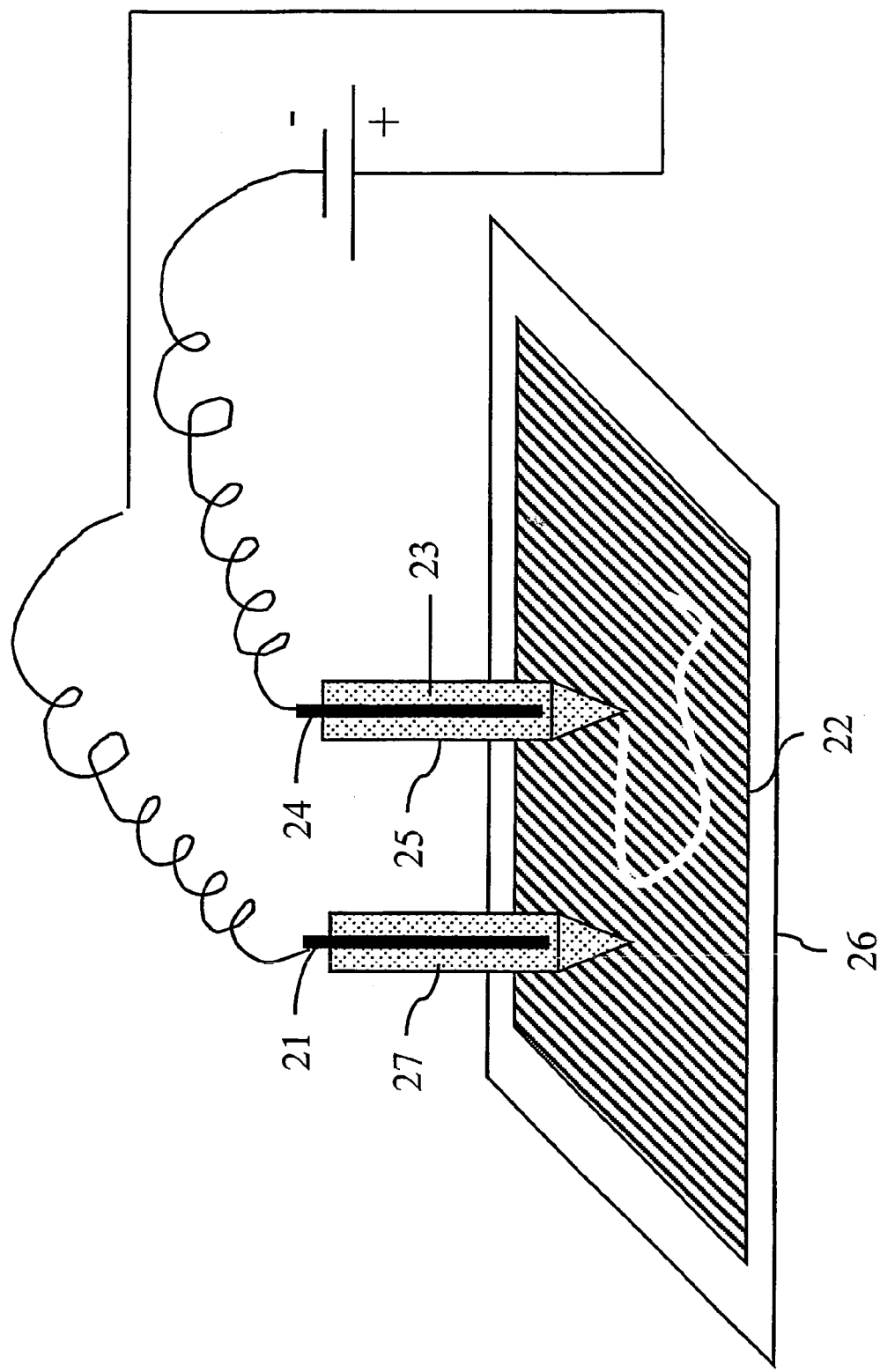
FIG. 2 is a schematic view of an electrically conducting polymer on a substrate, which is rendered locally non-conducting through the action of a plotter pen adapted to contain electrolyte and an electrode, in accordance with a further embodiment of the invention. A second plotter pen supplies an electrode and electrolyte for establishing a potential difference.

A similar process set-up is shown in FIG. 2, with the exception that the first electrode 21 is no longer in direct electrical contact with the edge of the polymer film. Otherwise, this set-up comprises the same elements as described above in relation to FIG. 1 Thus, it comprises an electrolyte 23 and a second electrode 24 which are confined inside a container 25. The first electrode 21 is comprised in a container filled with electrolyte 27, with an opening for contact of the electrolyte with the polymer. However, the electrolyte 27 of the first electrode 21 need not be the same as the electrolyte 23 of the second electrode 24.

This mode of achieving a potential difference in the interface of polymer and electrolyte may be of particular use in cases where the polymer is first rendered non-conducting in e g a closed circle. If further deactivation within this circle is desired, the approach of connecting the edge of the film with the first electrode (as shown in FIG. 1) will not be adequate to provide a potential difference within the area closed off by the previously deactivated circle, since that area has been isolated. The provision of a movable first electrode, such as that pictured in FIG. 2, solves this problem by making possible the establishing of a potential difference within such closed areas. An analogous solution provides a movable first electrode without the electrolyte container, e g a movable copper electrode in direct electrical contact with the polymer film. The movement of this first electrode, whether encased in an electrolyte-filled container or "naked", may be realised with the help of the same or a different plotting equipment as described above for FIG. 1.

Figure 11:
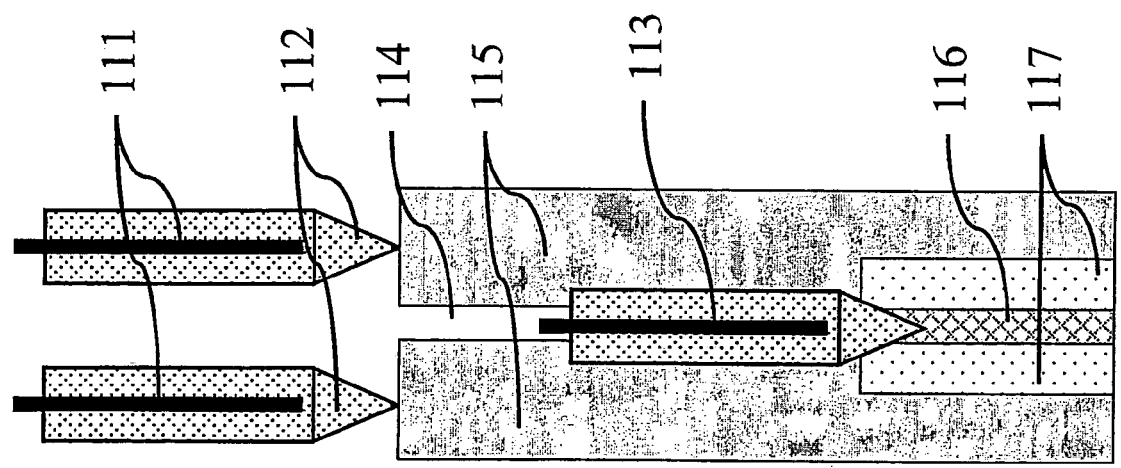
FIG. 11 is schematic illustration of an embodiment using an electrolyte for providing direct electrical contact between an electrode and the polymer.

The use of an electrolyte 27 as an interface between the first electrode 21 and the polymer 22 has the further advantage of facilitating a complementary electrochemical process in the region covered by electrolyte 27, which can be used advantageously for obtaining even higher line-width resolution. Thus, FIG. 11 illustrates a set-up where the first electrode is split into two electrodes 111, each having a container filled with electrolyte 112. The electrodes 111 are moved separated from and in parallel of each other, thus exposing two parallel strips 115 of the polymer for a complementary electrochemical reaction, the strips 115 being separated by a narrow, unexposed strip 114. By moving the first, electrode 113 along the narrow strip 114, only an extremely narrow strip is rendered non-conducting. This is due to the prior exposure of the overlapping regions 117 for the complementary reaction, which serves as a protection for the regions 117 from being rendered non-conducting. Thus, by applying the strips 115 close enough to each other, a narrower strip is rendered non-conducting as compared to the case where the resolution of the pattern is determined by the width of the applied electrolyte strip.

Figure 3:
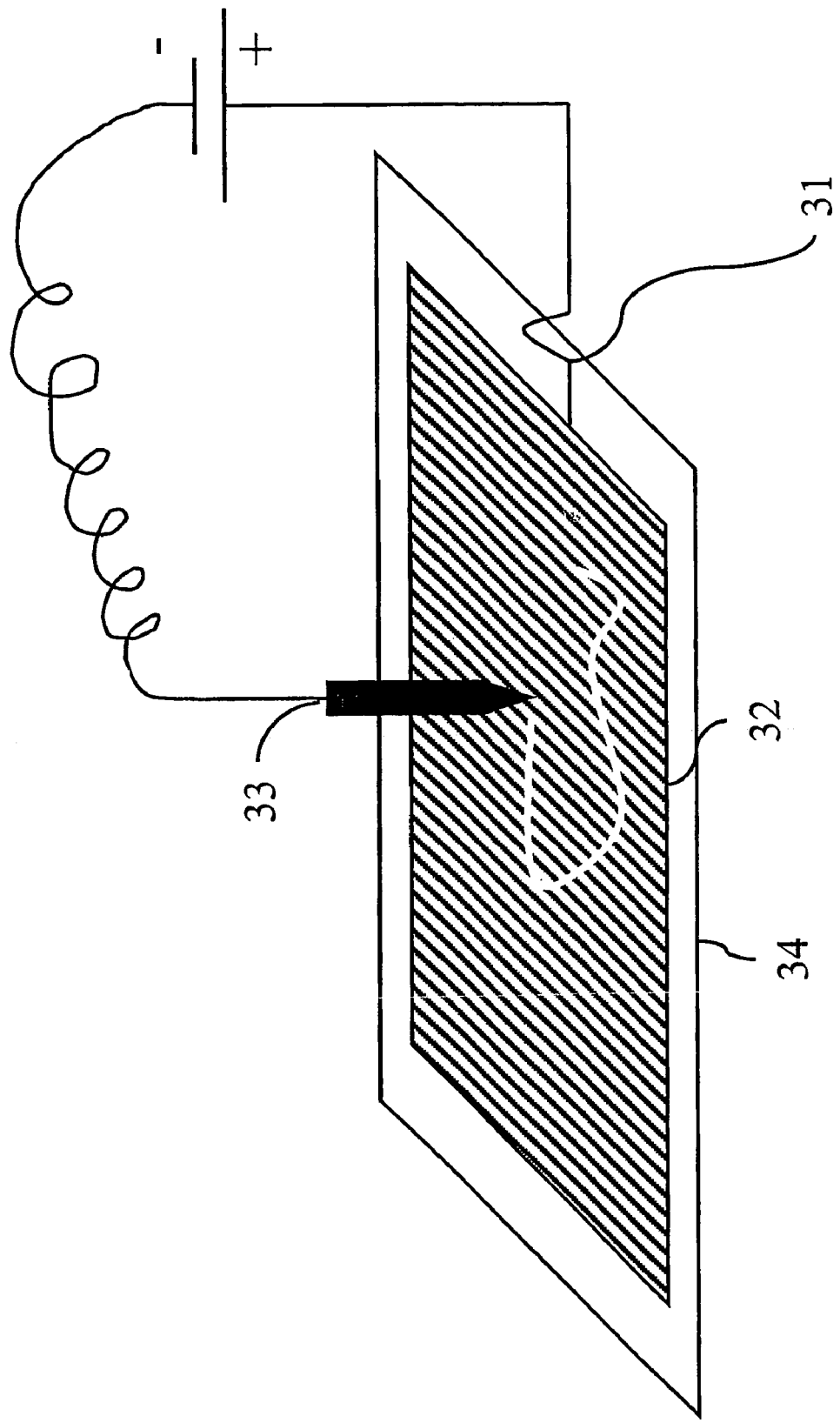
FIG. 3 is a schematic view of an electrically conducting polymer on a substrate, which is rendered locally non-conducting through the action of a sharp electrode tip immersed in a layer of high-resistivity electrolyte (not shown), in accordance with a further embodiment of the invention.

In another preferred embodiment of the invention, shown in FIG. 3, the first electrode 31 contacts the edge of a polymer film 32 directly. A movable second electrode 33 is provided, which is equipped with a pointed tip. The polymer film is preferably placed on a flat support 34, which may be of a flexible material. The second electrode can be the probing tip of an atomic force microscope (AFM). In this embodiment, the whole polymer film is covered with a thin layer of a liquid electrolyte with high resistivity (not shown). The tip of the second electrode is brought into very close proximity to the polymer film, immersing it in the layer of liquid electrolyte. The application of a voltage between film and electrode gives rise to localised electrochemical reactions between polymer and electrolyte that render the polymer non-conducting only very close to the tip of the second electrode. When the probing tip of an AFM is used, a pattern resolution of the order of 1 μm or less can be achieved, depending on the radius of the probing tip serving as the second electrode.

Figure 14:
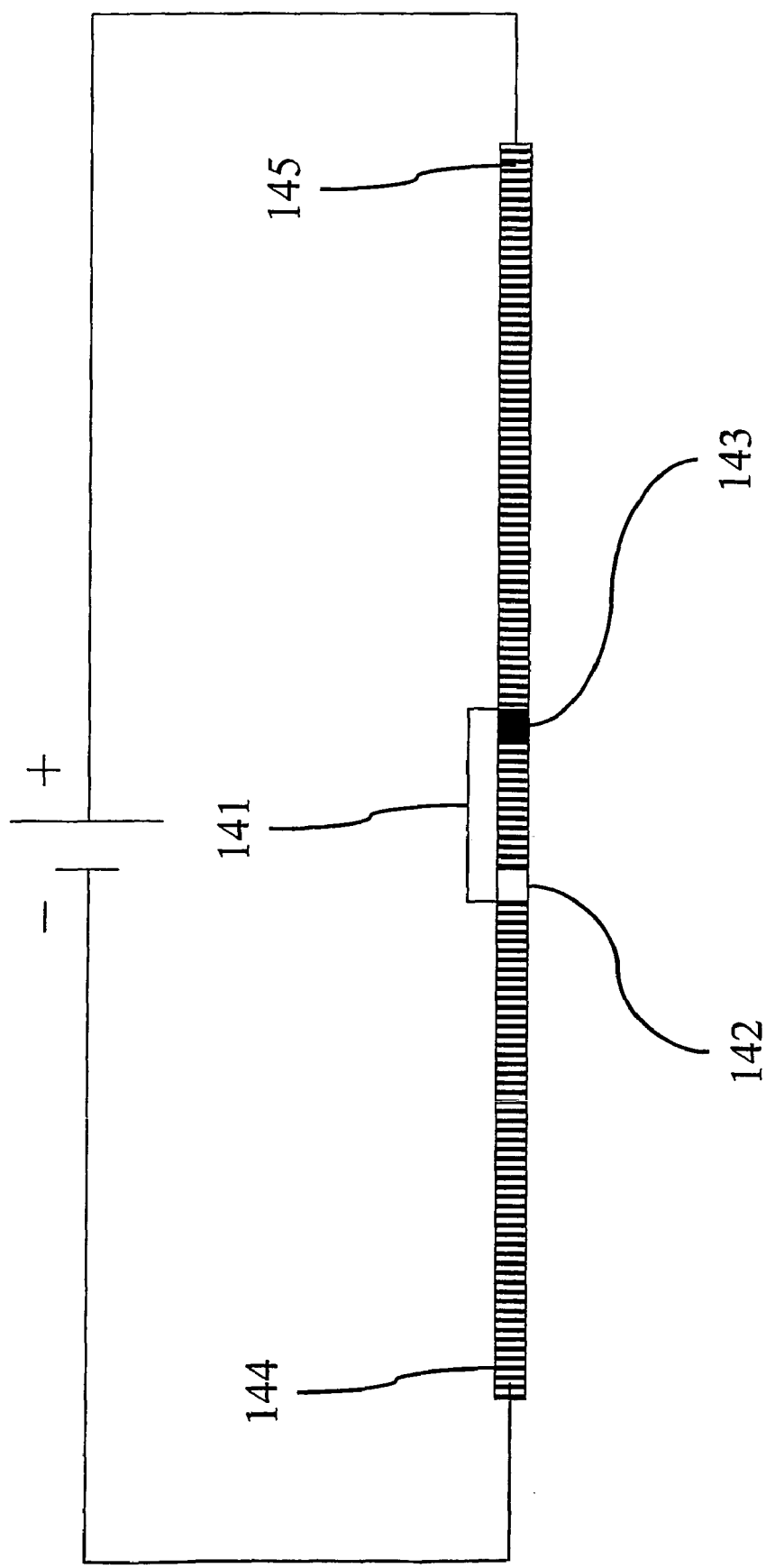
FIG. 14 is a schematic cross-sectional view of an embodiment according to which two electrodes are applied to the polymer, one on each side of an electrolyte layer.

According to still another embodiment, the electrodes are both connected to the polymer. FIG. 14 depicts a schematic cross-sectional view of such an embodiment, in which the electrolyte is applied as a strip 141. A voltage is supplied to the electrolyte via a first electrode 144 and a second electrode 145. Due to the conductivity of the electrolyte 141, charges passing between the electrodes 144, 145 are directed through the electrolyte strip 141, thus rendering a region 142 of the polymer non-conducting, whereas a region 143 is subjected to the complementary electrochemical reaction. This complementary reaction may for some polymers serve to decrease electrical conductivity therein, which in turn directs more charge to flow through the electrolyte, further accelerating the electrochemical reactions rendering the material non-conducting in the region 142. For some applications, this embodiment is expected to facilitate enhanced resolution of the non-conducting pattern.

In alternative preferred embodiments of the present invention, the polymer is brought into contact with electrolyte using other easily adaptable methods. In particular, printing processes such as offset printing, flexographic printing, gravure printing etc may be adapted to carry out the process according to the invention. One series of such embodiments utilises a printing process employing a cylinder, and has been illustrated in FIGS. 4-6. In these printing processes, a pattern resolution of the order of about 50 μm is obtainable.

Figure 4:
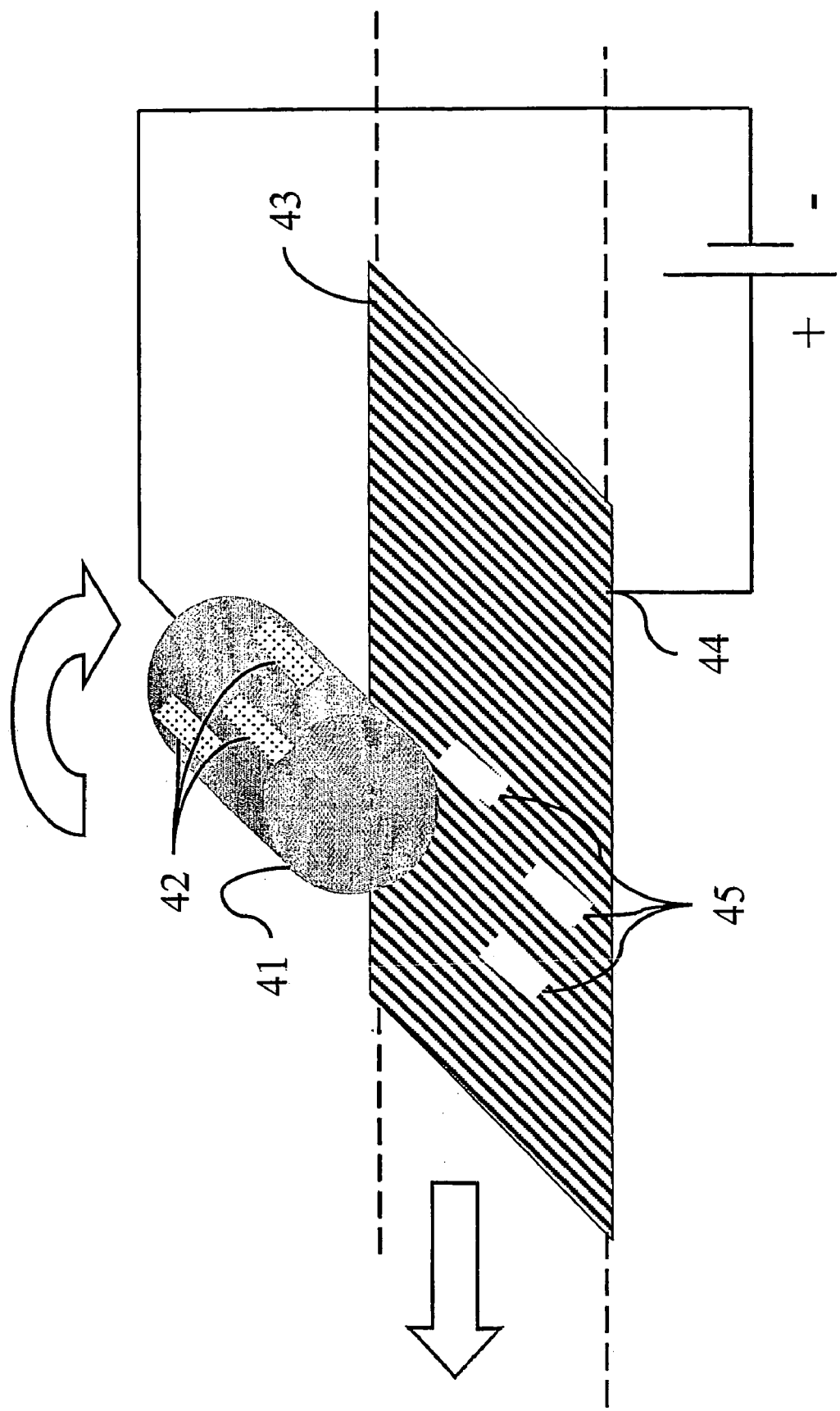
FIG. 4 is a schematic view of a travelling sheet of an electrically conducting polymer, which is rendered locally non-conducting by a printing process employing a cylinder according to an embodiment of the invention.

Referring first to FIG. 4, a rotating cylinder 41 of a conducting material is prepared, which corresponds to a conventional roll in an offset printing equipment. The cylinder is connected to a voltage supply, and the surface of the cylinder is covered with an insulating material. In preparation of the cylinder, the insulating surface material is removed at certain locations 42, baring the conducting surface underneath. The pattern formed by these bared conducting surfaces should correspond to a mirror image of the desired pattern of deactivated polymer on the film. The insulating surface material thus removed is replaced by a printable electrolyte, which thus is brought into direct electrical contact with the conducting surfaces underneath. In the process according to this embodiment of the invention, a sheet of polymer film 43, which is contacted by a first electrode 44, is brought into contact with the cylinder in a continuous web manner, and a voltage is applied between the first electrode 44 and the cylinder 41, the cylinder serving as the second electrode. When the polymer film comes into contact with the cylinder, electrochemical reactions in the interface between electrolyte and polymer take place, rendering the polymer non-conducting at locations 45 where it contacts the parts of the cylinder covered with electrolyte. The parts of the cylinder covered with insulating material, however, have no effect on the polymer.

Figure 5:
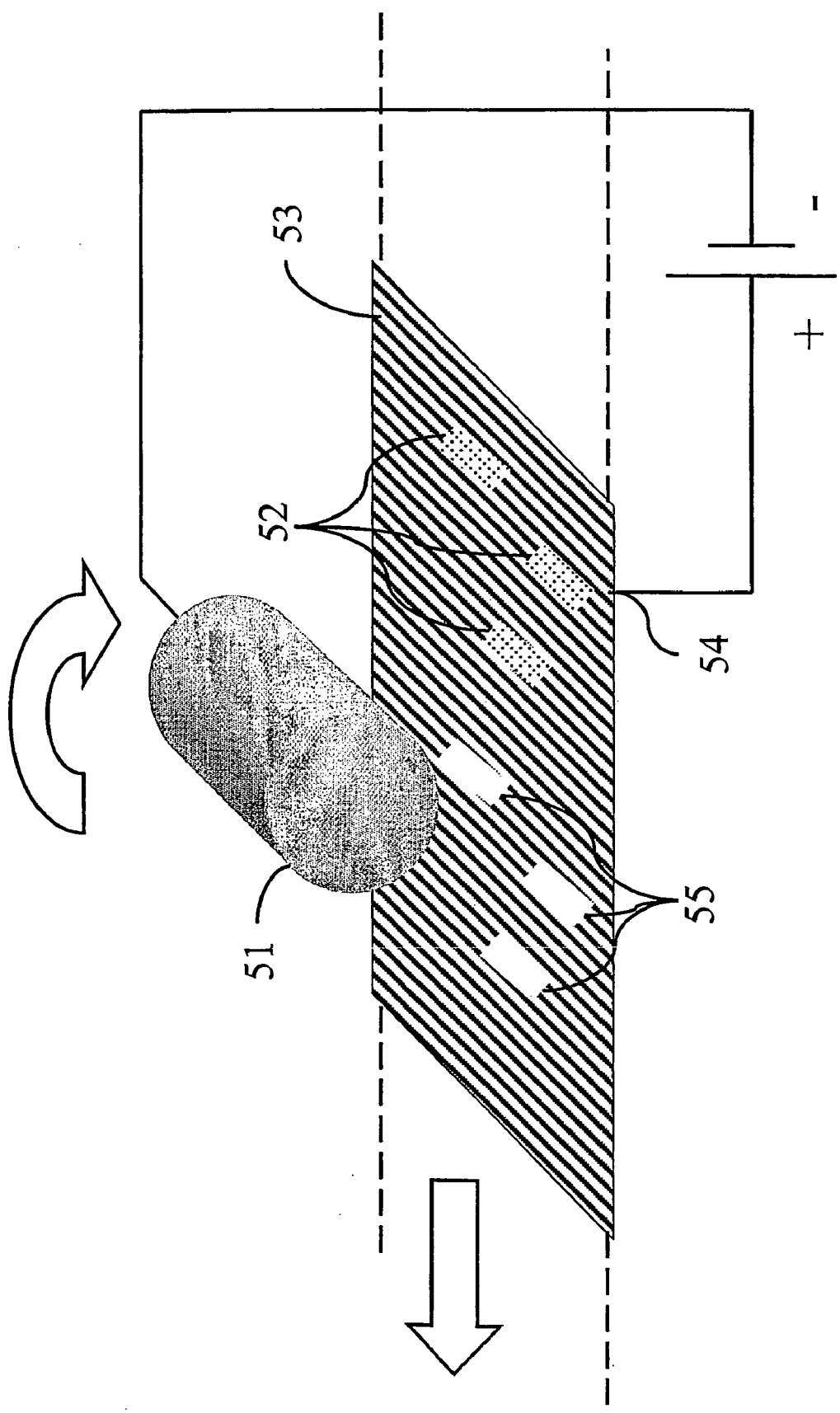
FIG. 5 is a schematic view of a travelling sheet of an electrically conducting polymer, which is rendered locally non-conducting by a printing process employing a cylinder according to another embodiment of the invention.

Referring to FIG. 5, a similar set-up is shown. A cylinder 1 of a conducting material, again corresponding to a conventional roll in an offset printing equipment, is prepared and connected to a voltage supply. In contrast to the description above in relation to FIG. 4, however, the surface of the cylinder is not covered with an insulating material. Rather, the entire surface of the cylinder is conducting. In the process according; to this embodiment of the invention, electrolyte 52 in a suitable form is deposited on a sheet of polymer film 53 in advance, in a pattern corresponding to the desired pattern of deactivation. This deposition may be performed by any known method, including ink-jet printing, screen printing, offset printing and flexographic printing. The sheet of polymer film is brought into contact with a first electrode 54, and with the cylinder in a continuous web manner, and a voltage is applied between the first electrode 54 and the cylinder 51, the cylinder serving as the second electrode. When the conducting cylinder contacts the electrolyte deposited on the polymer film, electrochemical reactions in the interface between electrolyte and polymer take place, rendering the polymer non-conducting at locations 55 where electrolyte was deposited.

Figure 6:
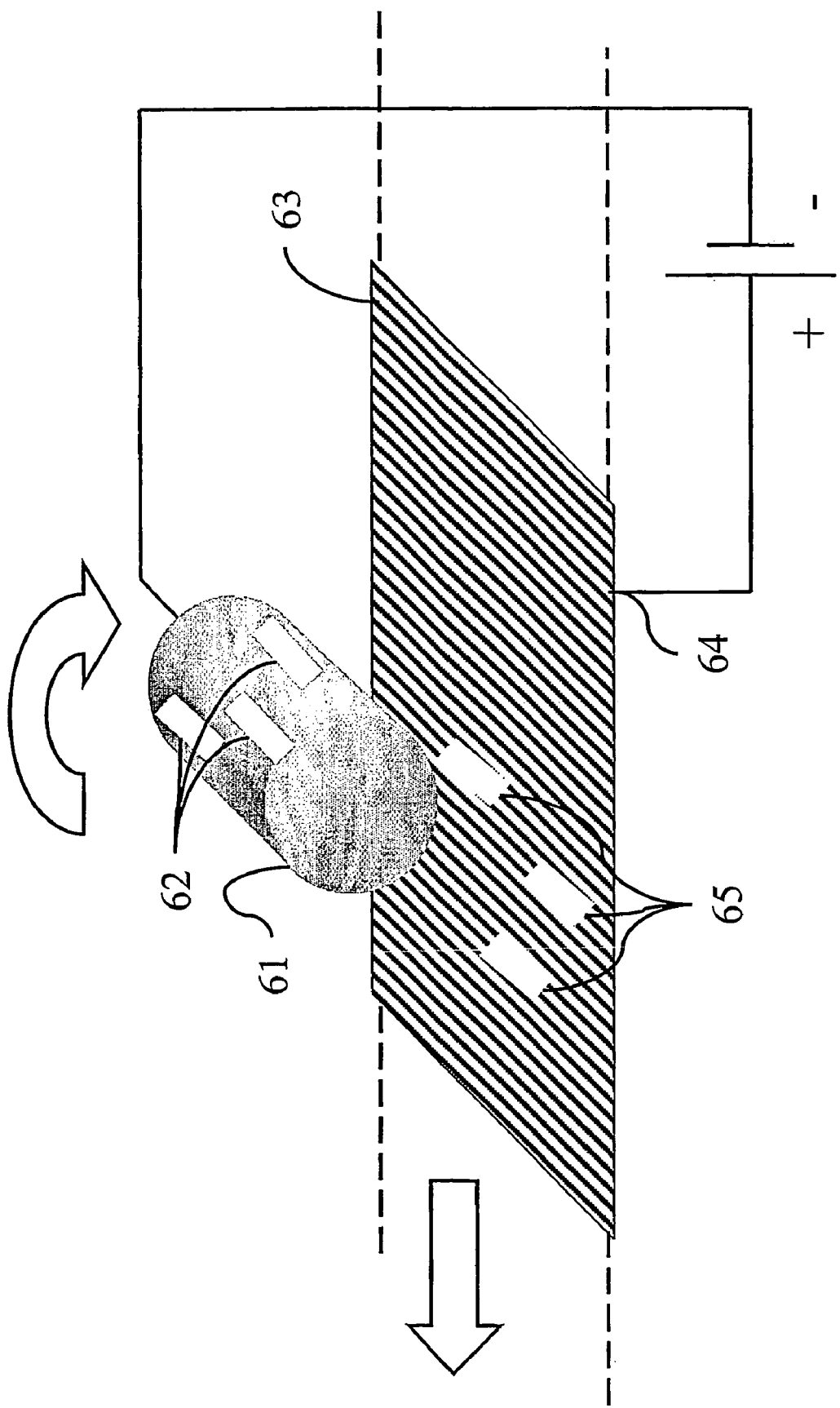
FIG. 6 is a schematic view of a travelling sheet of an electrically conducting polymer, which is rendered locally non-conducting by a printing process employing a cylinder according to yet another embodiment of the invention.

In the set-up illustrated by FIG. 6, a cylinder 61 is once again covered with an insulating material. The insulating material is removed in a pattern 62 corresponding to the mirror image of the intended pattern of deactivation on a sheet of polymer film 63. In this embodiment, however, the conducting surfaces thus bared by removal of insulating material are in the same plane as the rest of the cylinder surface, so that they may contact the polymer film directly during the process of the invention. In this embodiment of the process according to the invention, the sheet of polymer film is brought into contact with a first electrode 64, and with the cylinder in a continuous web manner, and a voltage is applied between the first electrode 64 and the cylinder 61, the cylinder serving as the second electrode. In analogy to the embodiment described above in relation to FIG. 3, electrolyte is provided as a thin layer of a liquid electrolyte with high resistivity (not shown) on the polymer film. In the present case, this may be provided as a bath of e g distilled water through which the sheet of polymer film travels at the point of contact with the cylinder. During the process, the polymer is brought into very close proximity to the cylinder. At places where the cylinder surface is conducting, electrochemical reactions in the interface between electrolyte and polymer occur, rendering the polymer non-conducting at locations 65 where it contacts the parts of the cylinder surface that are conducting. The parts of the cylinder covered with insulating material, however, have no effect on the polymer.

In alternative embodiments, the same approaches as those described above for roll-to-roll processes may be used in connection with non-continuous processes, employing for example a punch. In such embodiments, the punch corresponds to the cylinder described above, and may be provided with a mirror image pattern of the intended pattern of deactivation on the polymer and connected to a voltage supply. The adaptation of the roll-to-roll processes to such non-continuous processes is well within the grasp of the skilled person in light of the above description.

The process according to the invention may also be used together with screen printing equipment. Two alternative embodiments of the use of printing screens are described below with reference to FIGS. 7 and 8. Using such screen printing processes, a pattern resolution of the order of 50-100 µm may readily be obtained.

Figure 7:
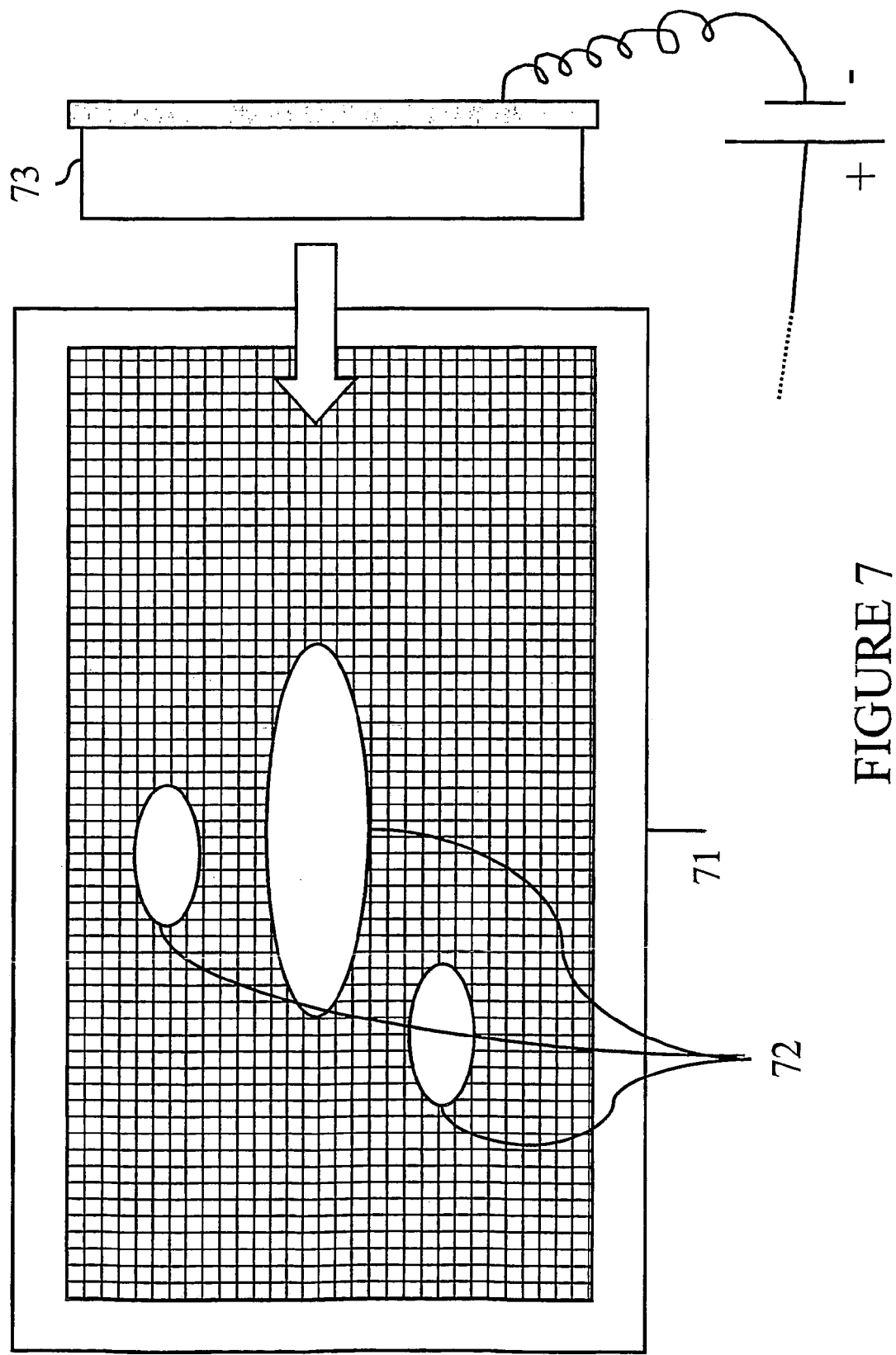
FIG. 7 is a top view of a printing screen with squeegee for use in an embodiment of the present invention.

In the set-up illustrated in FIG. 7, a conventional screen 1 is provided, with a mesh of nylon threads covered with a sealing. The sealing is removed in a pattern 72 corresponding to the intended pattern of deactivation on the polymer. In the process according to this embodiment of the invention, a piece of polymer film is connected to a first electrode. Subsequently, the polymer piece is covered with the screen. A squeegee 73 of a conducting material is connected to a second electrode. The squeegee is then used to manually spread; an electrolyte gel or paste over the screen instead of conventional screen printing paste or ink. During the spreading of gel electrolyte by the squeegee, a voltage is applied between the electrodes. The polymer film will be contacted by electrolyte only where the sealing of the printing screen has been removed, and electrochemical reactions deactivating the polymer will occur in the interface between polymer and electrolyte in response to the applied voltage. A pattern of deactivated polymer corresponding to the pattern of "open" areas in the screen will be the result.

Figure 8:
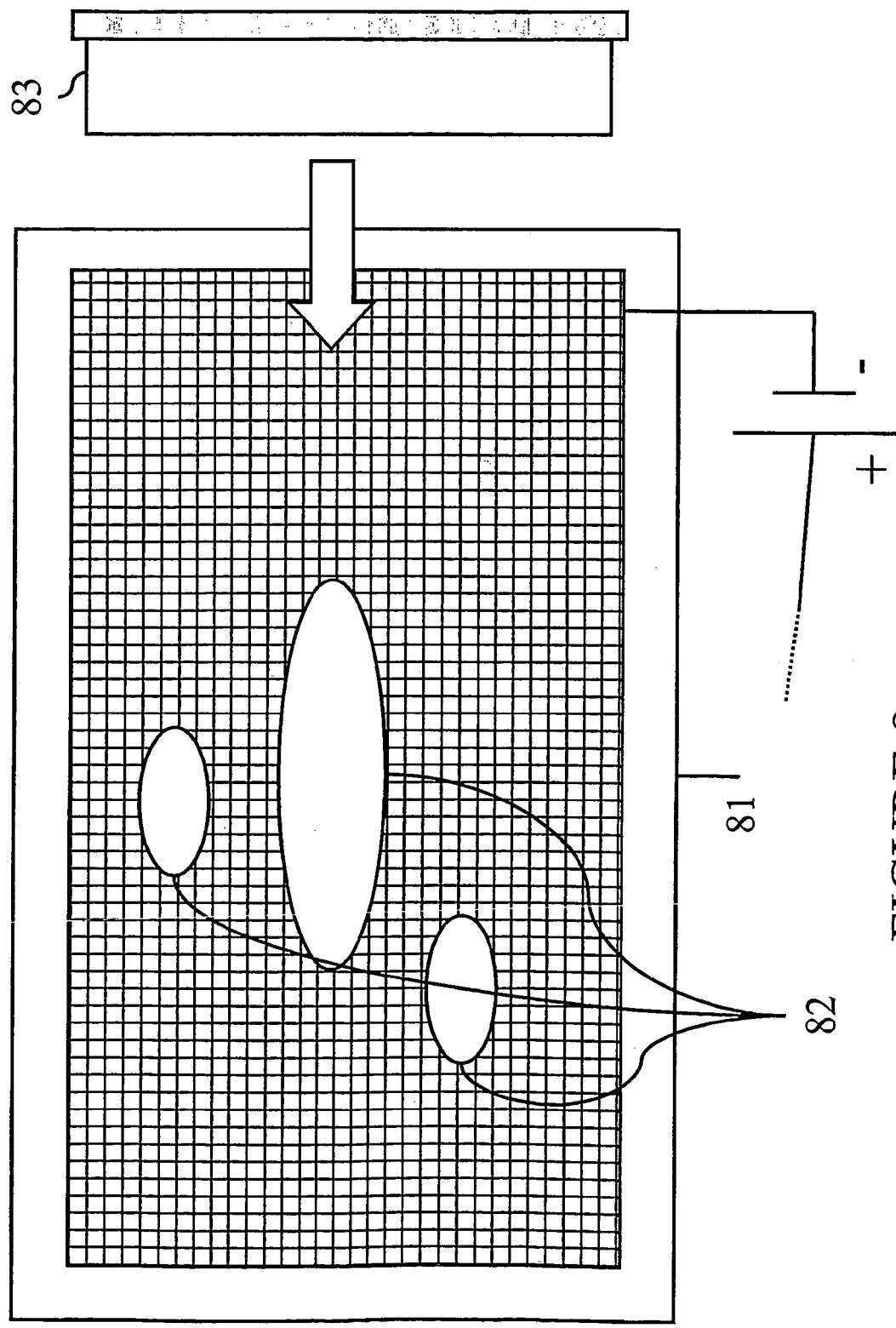
FIG. 8 is a top view of a printing screen with squeegee for use in another embodiment of the present invention.

In an alternative to this set-up, illustrated in FIG. 8, the mesh of the screen itself is of a conducting material, such as steel, and covered with an insulating sealing. The sealing is removed in a pattern 82 corresponding to the intended pattern of deactivation on the polymer. In the process according to this embodiment of the invention, a piece of polymer film is connected to a first electrode. The polymer piece is covered with the screen, and the screen is connected to a second electrode directly. The first and second electrodes are connected to the voltage supply. An electrolyte gel or paste is spread over the screen instead of conventional screen printing paste or ink by a squeegee 83. When the electrolyte is brought into contact with the polymer underneath the "open" areas of the screen, the potential difference between polymer and screen mesh will give rise to electrochemical reactions in the interface between polymer and electrolyte, rendering the polymer non-conducting where this has occurred.

In another embodiment of the invention, an electrolyte having a relatively high conductivity, and/or a high or pulsed voltage, facilitates another mode of operation. The electrolyte is applied using any of the above described methods. However, when applying the voltage, the charge will be concentrated to the boundaries of the electrolyte, due to the conductivity of the electrolyte. Consequently, most of the electrochemical reaction will take place in the proximity of the edges of the electrolyte drop or film. Thus, the electrochemical reaction will render the edges of the electrolyte pattern non-conducting while leaving the interior of the patterned area essentially unaffected. Furthermore, the more non-conducting the edges, the more insulated the interior, and the more insulated the interior, the less the interior will be polarized. Therefore, the edges of the pattern can be made fully non-conducting while the interior is left essentially unaffected and thus remains conducting.

Figure 9:
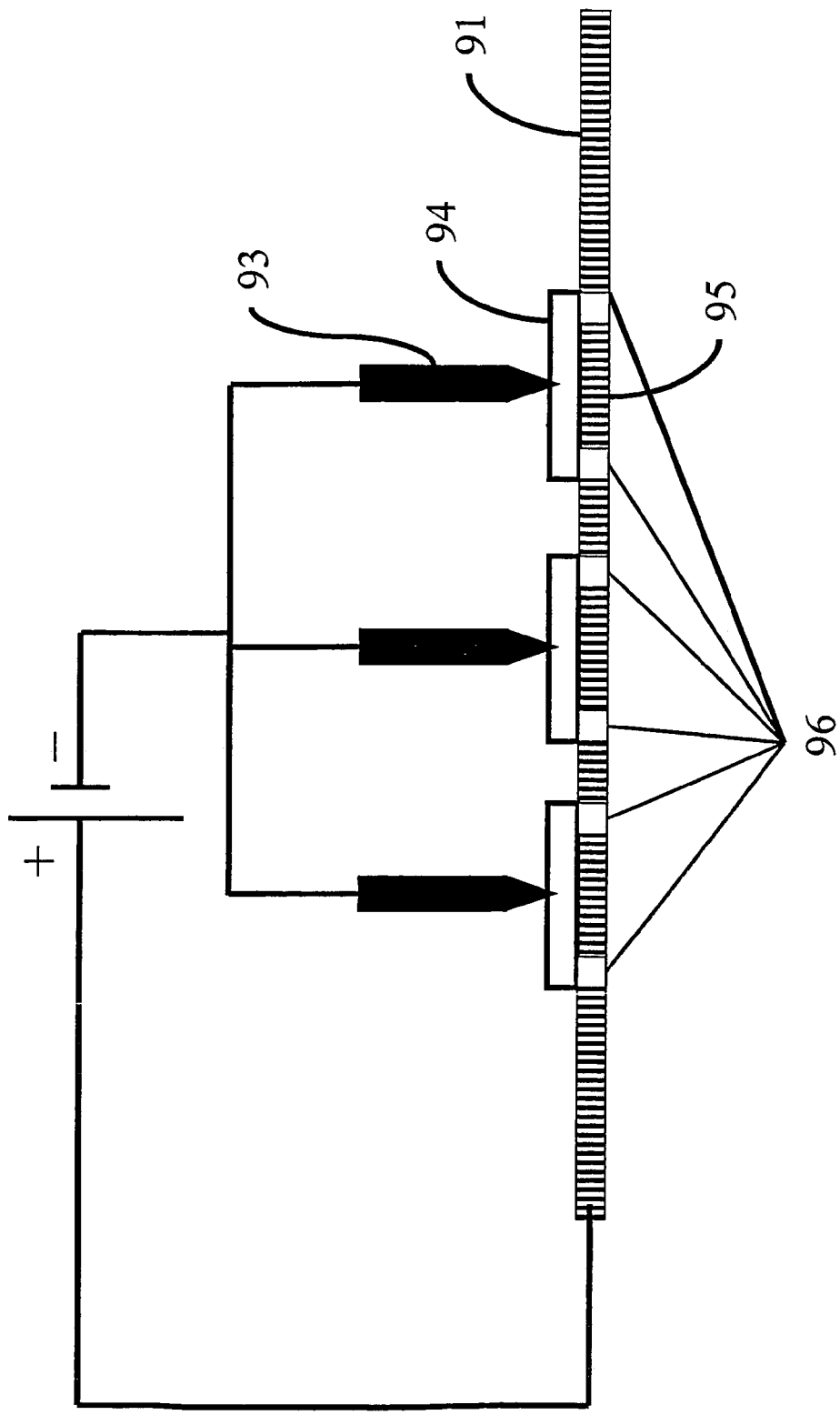
FIG. 9 is a schematic cross-sectional view of an embodiment of the invention, using conducting electrolyte.

As illustrated in FIG. 9, a narrow strip 95 can be insulated from its surroundings by patterning a somewhat wider strip 94 of electrolyte having high conductivity. When applying the voltage, only the outer portions 96 will be rendered non-conducting, while leaving the interior, i e the narrow strip 95, unaffected. As illustrated in FIG. 10 a and b, it is furthermore possible to insulate an arbitrary portion 106 of the polymer 103 from its surroundings. This is achieved by applying electrolyte 104 having a relatively high conductivity to a portion corresponding to, but slightly larger than, the desired portion and subsequently applying a high or pulsed voltage to the electrolyte using an electrode 102.

Figure 12:
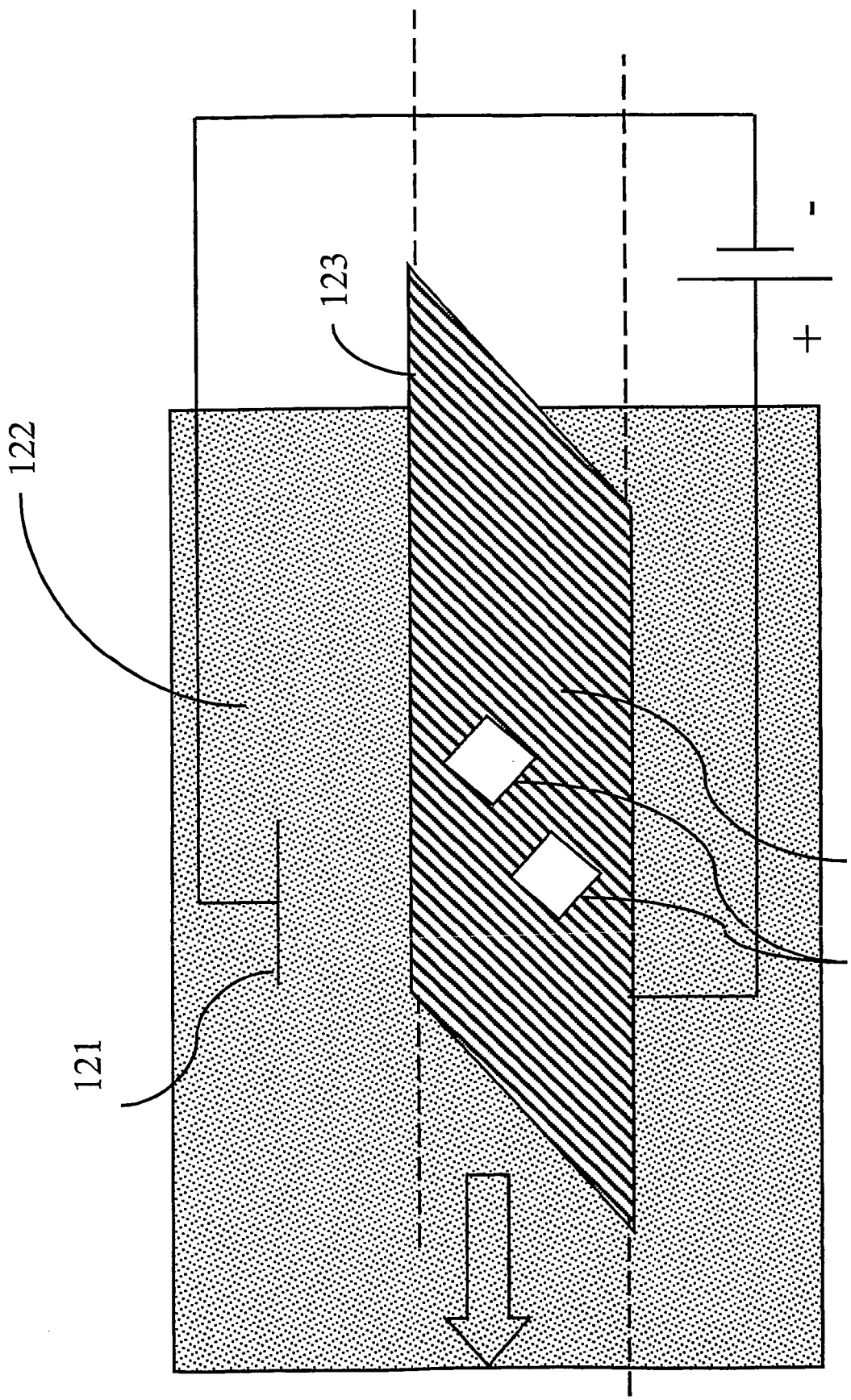
FIG. 12 and 13 are schematic illustrations of an embodiment involving the application of a protective layer to the polymer.
Figure 13:
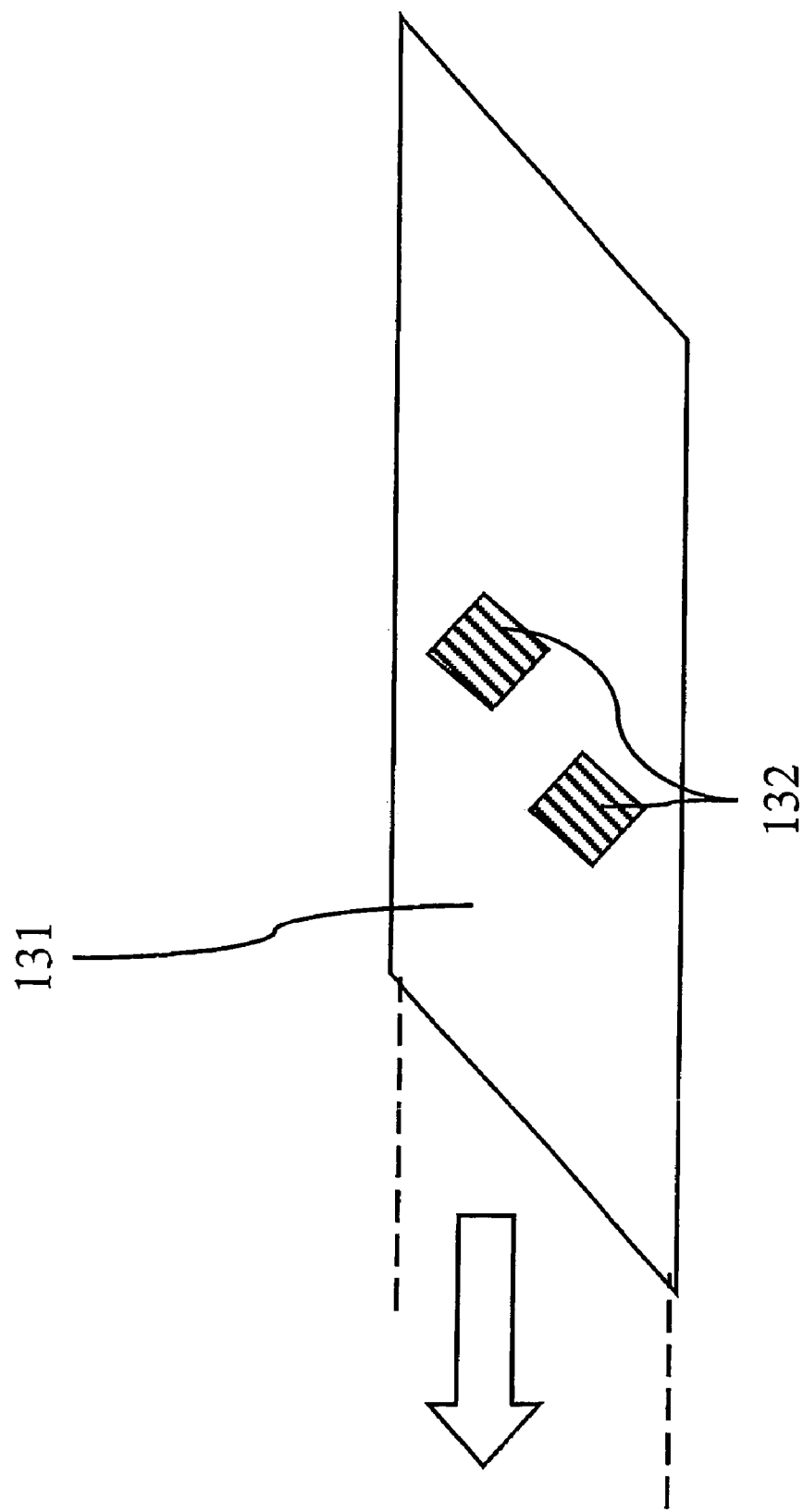

In a still further embodiment of the invention, schematically illustrated in FIGS. 12-13, a pre-patterned protective layer is applied to the polymer, prior to application of the electrolyte. The protective layer can, for example, be achieved using a photolithographic process. To this end, a photoresist, e g printing ink, is applied to the surface of the polymer 123, and exposed to UV light in a pattern 125 that is to be rendered non-conducting. By developing the pattern 125, a protective layer is achieved, protecting the areas of the polymer 123 which is to remain conducting from electrolyte. Thereafter, electrolyte 122 is applied to a large part of the polymer surface, including at least the regions that are to be rendered non-conducting 125, and electrodes 121, 124 are applied to the electrolyte 122 and the polymer 123, respectively. The electrolyte can be applied for example by submerging the polymer in electrolyte, or by applying a film of electrolyte. If using a film, it is preferred to use an electrolyte having a relatively high conductivity.

The process of this embodiment results in parts 132 of the polymer being rendered non-conducting, while the other parts 131 are left unaffected.

The desired effect of the electrochemical reactions resulting from the applied electric voltage is to render the electrically conducting polymer non-conducting. For this to occur, the electrically conducting polymer is preferably such that a suitably high voltage difference between the first and second electrodes results in an oxidation or reduction reaction that is sufficient to render the polymer non-conducting in the area of contact between electrolyte and polymer. Such polymers are for example those that exhibit conductivity in some redox state because they comprise a conjugated system of $\pi$-orbitals. Subjecting these polymers to a sufficiently high positive polarisation at the interface with an electrolyte will cause an irreversible disruption of the $\pi$-system, rendering the polymers permanently non-conducting where this has occurred. The phenomenon is referred to as over-oxidation. Such electrically conducting polymers, being especially suitable for use in the process of the invention, are preferably selected from the group consisting of polythiophenes, polypyrroles, polyanilines, polyisothianaphthalenes, polyphenylene vinylenes and copolymers thereof such as described by J C Gustafsson et al in Solid State Ionics, 69, 145-152 (1994); Handbook of Oligo- and Polythiophenes, Ch 10.8, Ed D Fichou, Wiley-VCH, Weinhem (1999); by P Schottland et al in Macromolecules, 33, 7051-7061 (2000); Technology Map Conductive Polymers, SRI Consulting (1999); by M Onoda in Journal of the Electrochemical Society, 141, 338-341 (1994); by M Chandrasekar in Conducting Polymers, Fundamentals and Applications, a Practical Approach, Kluwer Academic Publishers, Boston (1999); and by A J Epstein et al in Macromol Chem, Macromol Symp, 51, 217-234 (1991). In an especially preferred embodiment, the electrically conducting polymer is a polymer or copolymer of a 3,4-dialkoxythiophene, in which said two alkoxy groups may be the same or different or together represent an optionally substituted oxy-alkylene-oxy bridge. In an even more preferred embodiment, the polymer is a polymer or copolymer of a 3,4-dialkoxythiophene selected from the group consisting of poly(3,4-methylenedioxythiophene), poly(3,4-methylenedioxythiophene) derivatives, poly(3,4-ethylenedioxythiophene), poly(3,4-ethylenedioxythiophene) derivatives, poly(3,4-propylenedioxythiophene), poly(3,4-propylenedioxythiophene) derivatives, poly(3,4-butylene-dioxythiophene), poly(3,4-butylenedioxythiophene) derivatives, and copolymers therewith. The polyanion compound is then preferably poly(styrene sulphonate). An especially preferred polymer for use in the process of the invention is oxidised poly(3,4-ethylenedioxythio-phene) with a poly(styrene sulfonate) polyanion (in the following referred to as PEDOT-PSS).

The optimal voltage to apply between electrodes will depend on the characteristics of the polymer used, the electrolyte used, and the manner in which the voltage is applied to the interface between polymer and electrolyte. However, the voltage is preferably in the range of from 10 to 100 V, more preferably between 25 V and 50 V. The use of these preferred voltages has been elucidated by the present inventors in light of a recognition of the following circumstances and relationships, imposing restrictions on what voltage should be used. Thus, the ranges given above are merely indicative of preferred values, and the voltage applied may fall outside of these, should the consideration of the following restrictions so necessitate. The relevant parameter for over-oxidation of a polymer is the drop in potential in the interface between the polymer and the electrolyte, which must exceed the ionization potential of the polymer used. However, the major drop in potential will occur within the electrolyte itself, between the polymer interface and the electrode. Furthermore, even though application of a certain voltage may be sufficient to render the polymer non-conducting, the process may be accelerated by further increasing the applied voltage. The rate at which over-oxidation of a polymer material occurs is also governed by the occurrence of nucleophiles (or, in certain cases, even electrophiles) in the electrolyte or in the polymer, which in turn for an aqueous electrolyte partly depends on the pH value. In the case of plotter tool deactivation such as described e g in connection with FIG. 1 above, the potential drop in the interface between the polymer and the electrolyte is preferably about 25 V.

The electrolyte for use in the process of the invention should be based on a solvent which permits ionic conduction in the electrolyte, i e allows for the dissociation of ionic substances such as salts, acids, bases etc. The solvent and/or the ionic substance may contribute nucleophiles. The electrolyte solution of ionic substance(s) should be conducting, and must not per se render the polymer non-conducting in the absence of voltage during the carrying out of the inventive process. Therefore, concentrated solutions of salts such as hypochlorites, manganates, chlorates or any other strongly oxidising substances must not be used. However, these substances can be used as additives for the electrochemical patterning described herein, if diluted to such an extent that the resulting electrolyte solution does not in itself render the polymer non-conducting during the carrying out of the inventive process. Possible electrolytes to use in the process according to the invention are solutions of salts, acids, bases, or other ion-releasing agents in solvents that support the dissociation of ionic species, thus allowing ionic conductivity. As non-limiting examples, mention can be made of: aqueous solutions of $NaCl$, $Na_2SO_4$, $H_3PO_4$, $H_2SO_4$, $KCl$, $RbNO_3$, $NH_4OH$, $CsOH$, $NaOH$, $KOH$, $H_2O_2$; organic solvents such as acetonitrile, pyridine, DMSO, DMF, dichloromethane etc in combination with suitable salts, such as lithiumperchlorate and tertiary ammonium salts, e g tetrabutyl ammonium chloride; inorganic solvents such as hypercritical $CO_2$, liquid $SO_2$, liquid $NH_3$ etc in combination with salts that dissociate in these solvents; solvents displaying auto-dissociation, which results in the formation of ionic species, such as water, formic acid and acetic acid.

The concentration of ionic species in the electrolyte, its conductivity and its viscosity all depend crucially on the manner in which the voltage for rendering the polymer non-conducting is applied, i e what patterning tool/printing technique and what voltage is used. If there is a very short distance between the second electrode and the polymer, the conductivity of the electrolyte may be very low. When the distance between the second electrode and the polymer is greater, a greater ionic conductivity, and thus a greater concentration of ions, is needed. If the process according to the invention is to be applied in a continuous manner, the electrolyte must also possess the proper viscosity to permit printing thereof by the selected equipment. In some embodiments of the invention, the nature of the electrolyte used also influences the resolution of an intended pattern, depending on its wetting properties. The resolution obtained in such embodiments depends on the contact area between the electrolyte and the polymer surface. This, in turn, depends on the tool for the deposition of the electrolyte and on the wetting properties of the electrolyte on the polymer surface. This wetting limits the maximum resolution that can be obtained, and may be reduced by introducing a step of rendering the polymer surface hydrophobic, in a continuous or patterned way, with agents such as Teflon or silanes (e g octadecyltrichlorosilane), prior to performing the process according to the invention. An electrolyte which has proven useful in the case of patterning of PEDOT-PSS with a plotter tool is a 0.5 M aqueous solution of KCl. In such embodiments of the invention where a printable electrolyte is preferred, commercially available conducting gels, e g for fastening electrodes to the skin in applications such as ECG, may advantageously be used. An example of such an electrolyte gel is Blågel, available from CEFAR, Lund, Sweden with product No.1330.

To further enhance the inventive process, it is possible to illuminate the region to be rendered non-conducting using a light source. The light source can for example be a laser means, projecting a laser beam onto the region to be rendered non-conducting. By illuminating the region, the electrochemical process is stimulated. Thus, it is for example possible to apply a potential just under the threshold value for the non-conducting reaction to occur, and confine the region of reaction to an illuminated spot/pattern.

It is also realised, that the voltage supplied to the electrodes can be a pulsed voltage. A pulsed voltage is advantageous for certain applications. "Direct electrical contact" is defined as follows: Direct physical contact (common interface) between two phases (for example electrode and electrolyte) that allows for the exchange of charges through the interface. Charge exchange through the interface may comprise transfer of electrons between electrically conducting phases, transfer of ions between ionically conducting phases, or conversion between electronic current and ionic current by means of electrochemistry at an interface between for example electrode and electrolyte or electrolyte and conducting polymer, or by occurrence of capacitive currents due to the charging of the interface between polymer and electrolyte. It is to be understood that "direct electrical contact" between an electrode and a polymer also includes the use of an electrolyte as a charge-exchanging interface between said electrode and said polymer. The electrolyte can, for example, be the electrolyte used for the electrochemical process for rendering the polymer non-conducting, or a separately applied electrolyte, possibly made up of a different substance. When reference is made to a polymer being rendered "essentially non-conducting" or simply "non-conducting", those terms are intended to encompass completely insulating polymer as well as polymer which has been rendered deactivated and insulating enough to be useful e g as an insulating barrier between areas of polymer that have not been rendered essentially non-conducting. Such essentially non-conducting polymers have preferably had their conductivity reduced by a factor greater than $10^3$, and even more preferably greater than $10^5$. Thus, to render a polymer essentially non-conducting or to render a polymer non-conducting is for the purpose of the present invention to be interpreted as the action of substantially reducing the conductivity of the polymer.

The inventive process is applicable to a multitude of electrically conducting polymers. However, for the inventive process to function, the polymer of course has to be able to perform electrochemistry. Furthermore, the polymer has to be able to transport a sufficient amount of charges so as to polarize the polymer enough for the electrochemistry to occur. As realised by a person skilled in the art, the conductivity needed varies from one application to another, primarily depending on the distance between the electrode applied to the polymer and the region to be rendered non-conducting.

In the case of a polymer film, which is rendered non-conducting through the application of a voltage on its surface using any of the arrangements described above, the depth of the resulting zone of non-conducting polymer is somewhat dependent on the thickness of the film used. If a sufficiently thick slab of polymer is used (with a thickness of the order of millimeters to centimeters), the deactivation may not be complete throughout the thickness of the film. This does not in itself detract from the usefulness of the process according to the invention, but it is preferred that the film be sufficiently thin for it to be rendered non-conducting in its entire thickness, preferably no thicker than about 10 µm.

The invention will now be further illustrated through exemplification of its use. The exemplification given is not intended as limiting in any way of the scope defined by the appended claims.

EXAMPLES

Example 1

Patterning of PEDOT-PSS According to the Process of the Invention Using Conventional Plotting Equipment The surface conductivity of PEDOT-PSS before and after electrochemical deactivation was determined as follows:

Two 12 cm×12 cm samples of PEDOT-PSS were cut from EL350 Orgacon™ foil (with an initial surface resistivity of 250 ohms per square measured as below) as provided by Agfa-Gaevert N. V. and designated sample A and sample B. On sample A, a central area of 10 cm×10 cm was rendered non-conducting by the process according to the invention using conventional plotting equipment with a plotter pen having a 1 mm felt tip for contact of electrolyte with polymer. An electrolyte, a 0.5 M aqueous solution of KCl, was filled into the plotter pen. In addition, a copper wire electrode connected to a voltage supply was immersed in the electrolyte within the plotter pen. A voltage of 25 V was applied between the electrode in the plotter pen and a PEDOT-PSS film, which was connected to the voltage supply via an electrode and placed on a flexible substrate (the PEDOT-PSS thus being polarised positively). The electrolyte at the tip of the plotter pen was then brought into contact with the PEDOT-PSS film. The PEDOT-PSS film was rendered non-conducting upon movement of the plotter pen across the PEDOT-PSS in a pattern of 200 overlapping lines defined using a graphics program on a PC (not shown) controlling the plotting equipment (not shown) of which the plotter pen was a part. The plotter speed used was 20 mm/second. Sample B was left in its pristine, conducting state.

Both samples were subsequently rinsed with copious amounts of deionised water, and dried at 60° C. for 15 min. After drying, two silver contacts (20×1.5 mm$^2$) were screen-printed onto the central areas of both samples at a distance of 20 mm from each other (according to IEC standard 93; VDE0303, part 30). A voltage of 10 V was applied between the contacts on each sample and the current was measured. The obtained result was a calculated resistivity of 50 MΩ per square for sample A, and a resistivity of 250Ω per square (same as the starting EL350 Orgacon™ foil) for sample B.

Investigation of the conductivity between two conducting PEDOT-PSS areas separated by a 1 mm wide stripe of deactivated PEDOT-PSS:

The PEDOT-PSS sample B (EL350 Orgacon™ foil) from the previous experiment was electrochemically patterned into two conducting entities separated by a 1 mm wide deactivated stripe using the procedure described above. Again, the sample was rinsed in deionised water and dried at 60° C. for 15 min.

After drying, a voltage of 10 V was applied between the silver contacts and the current was measured, resulting in a calculated resistivity of 2.5 MΩ between the two conducting PEDOT-PSS halves separated by the 1 mm wide, deactivated stripe.

Example 2

Patterning of PEDOT-PSS According to the Process of the Invention Using an Atomic Force Microscope The probing tip of an atomic force microscope (AFM) was used as the second electrode. A pyramidal Ni coated tip with an apex of 0.1 μm was used as the probing tip.

A PEDOT-PSS conducting film (having a surface resistance of 280Ω per square) was placed in a liquid cell filled with deionised water. The probing tip of the AFM was brought into close contact (range of μm) with the PEDOT-PSS film. Then, a voltage (polarising the PEDOT-PSS film positively) was applied between the tip of the AFM and the PEDOT-PSS film such that a current of 1 mA flowed and two areas of 1 μm$^2$ and of 100 μm$^2$, respectively, were scanned. The PEDOT-PSS film was deactivated over the corresponding areas of about 8 μm$^2$ and about 130 μm$^2$, respectively. The scanned areas could no longer be electrochemically reduced, while the non-scanned areas could.

Example 3

Patterning of PEDOT-PSS According to the Process of the Invention Using Conventional Offset Printing Equipment Materials and Methods:

Pattering of PEDOT-PSS (EL350 Orgacon™ foil with an initial surface resistivity of 250 ohms per square) was performed in a Heidelberg GTO ZP two colour offset printing machine (two printing units) with conventional dampening equipment. The offset plate used was a negative aluminium plate "Hercules" with an inverted pattern consisting of quadrants and lines with different stroke. Ordinary offset ink (Black ink from K+E, "172 skinnex") was used. The dampening additive used was Aqualith Z from Akzo Nobel, mixed with ordinary tap water in the proportion 5% additive to 95% water. The substrate used was A4 sized PEDOT-PSS-coated foil (EL350 Orgacon™ from Agfa).

Experimental set-up:

To establish electrical contacts to the offset plate, it was contacted using the side-wall of the printing machine near the plate cylinder. The PEDOT-PSS substrate was contacted at the rear end using an electrical wire. A voltage of 100 V resulting in a maximum current of 200 mA was employed. The printing speed was 5 meter/minute.

Results:

The test was made using the second printing unit in the offset press. The press was used as a direct lithography press, i e, the PEDOT-PSS-coated sheet was run between the plate cylinder and the blanket cylinder.

As electrolyte for electrochemical pattering we used the standard, water based, dampening solution in the offset press (see above). Electrical contact was made from the voltage supply via the sidewall of the press through the aluminium-plate via the electrolyte to the PEDOT-PSS-coated sheet (EL350 Orgacon™ foil), and from the rear end of the sheet back to the voltage supply. The offset plate was connected to the negative side and the PEDOT-PSS sheet to the positive side.

The machine was first allowed to run for one minute to establish equilibrium between colour and water on the offset plate. The maximum water level still giving an acceptable print was used. The machine was stopped and the PEDOT-PSS sheet was inserted by hand between the cylinders (between the plate cylinder and the blanket cylinder, as described above). Electrical contacts were applied, and the sheet was then run trough the machine by manual feeding.

Using the same measurement procedure as described in example 1 (the deactivation experiment with the plotter equipment), we achieved a surface resistance of 10 MΩ/square for the 10 cm×10 cm deactivated area and approximately 1 MΩ measured over a narrow line of deactivated PEDOT-PSS (width approximately 100 μm) separating two conducting PEDOT-PSS areas (for details se example 1).

Example 4

Patterning of PEDOT-PSS According to the Process of the Invention Using a Punch with a Photolithographically Defined Pattern Fabrication of a Punch:

A quartz substrate covered with a thin layer of evaporated chromium and a photoresist top layer (SLW 5009 10C AR3 S1800) was purchased from HOYA Corporation, Europe Branch. The photoresist layer was patterned with test structures (lines with widths in the range of 5-100 μm) using standard photolithography equipment. In addition, the photoresist layer displayed openings at the edges of the substrate allowing for electrical connection of the chromium metal layer to a voltage supply.

Pattern transfer to PEDOT-PSS by electrochemical deactivation:

The following steps were performed:

A 10 cm×10 cm piece of PEDOT-PSS-coated PET foil (EL350 Orgacon™ foil, as provided by Agfa) was connected at the edges to the voltage supply using conducting copper tape.

After humidifying the PEDOT-PSS coating by dipping it into deionised water, the punch was pressed against the PEDOT-PSS coated PET foil for about 2 s. During this time, a potential difference of 50 V was applied between the PEDOT-PSS coating (positive polarisation) and the punch (negative polarisation).

The punch was removed, and the sample was rinsed in deionised water and dried at 60° C. for 15 min.

To determine the max. resolution obtained, a suspension of zinc powder in water was applied to the PEDOT-PSS surface. Whereas active PEDOT-areas turn blue upon spontaneous reduction by zinc, deactivated areas remain unaffected and can easily be observed (and their size measured) using an optical microscope. The maximum resolution determined in that way was in the range of lines displaying widths of about 20 μm.

Example 5

Patterning of PEDOT-PSS According to the Process of the Invention Using Conventional Screen-printing Equipment An A4-sized PEDOT-PSS-coated PET foil (EL350 Orgacon™) was placed onto the vacuum table of a manual screen-printing equipment. The edges of the PEDOT-PSS coating were connected via copper tape to a voltage supply. Two different ways of patterning were then tried. Experiment A corresponds to the set-up illustrated schematically in FIG. 7, whereas experiment B corresponds to FIG. 8:
- A) A commercial, conducting gel, "Blågel Elektrodgel" purchased from CEFAR (normally used for TENS, TEMS, EMG and ECG measurements) was used as the screen-printing electrolyte/ink. The screen was made from a plastic material and had a screen mesh of 120 threads/cm. A potential of 50 V was applied between a conducting squeegee (negative potential) and the PEDOT-PSS coated PET foil (positive potential), and one manual printing stroke was made with the squeegee.
- B) In the second experiment, the screen was made of conducting steel threads (stainless steel with a 77 threads/cm mesh) covered with an electrically insulating emulsion in such a manner as to allow electrical contact only within the open areas corresponding to the patterns to be transferred. The electrolyte/ink in the form of ordinary, water based, screen printing ink (3380 Texacool TXC, a textile screen ink, purchased from Marabu) was applied to the screen. A potential of 50 V was applied between the screen (negative potential) and the PEDOT-PSS coated PET foil (EL350 Orgacon™ (positive potential) and one manual printing stroke was made with a non-conducting rubber squeegee.

After the printing process both samples were rinsed with copious amounts of deionised water and dried at 60° C. for 15 minutes. For determination of the maximal resolution obtained in each of the experiments, a suspension of zinc powder in water was applied to the PEDOT-PSS surfaces. Whereas active PEDOT-areas turn blue upon spontaneous reduction by zinc, deactivated areas remain unaffected and can easily be observed (and their size measured) using an optical microscope. The maximal resolution determined in this way was in the range of lines displaying widths of 50 microns for the 120 mesh screen of experiment A, and widths of 80 microns for the 77 mesh screen of experiment B.

Example 6

Patterning of PEDOT-PSS According to the Process of the Invention and Involving the Step of Making the Substrate Hydrophobic The conductivity of PEDOT-PSS (EL350 Orgacon™ foil) before and after electrochemical deactivation was determined as follows:

Two 5 cm×5 cm samples of PEDOT-PSS were cut from an EL350 Orgacon™ foil as provided by Agfa-Gaevert N.V. and designated sample A and sample B, respectively. Sample A was treated for 60 minutes in a silane solution, which was 5% octadecyltrimethoxysilane in toluene, thus rendering it hydrophobic. Thereafter, for the purpose of cleaning it from any remaining silane, sample A was rinsed in pure toulene. This was achieved by inserting it sequentially into two different bottles, each containing pure toluene, and submerging it for a period of 20 min in each bottle. The toluene was removed from sample A by putting the sample in an oven at 50° C. for 10 minutes.

A 20 mm long line was deactivated in the middle of both samples using conventional plotting equipment comprising a plotter pen having a 0.3 mm felt tip suitable for applying electrolyte on a polymer. An electrolyte constituted by a 0.5 M aqueous solution of KCl was filled into the plotter pen, and a copper wire electrode was immersed in the electrolyte within the plotter pen. Furthermore, each sample were placed on a flexible substrate and provided with an electrode.

A voltage of 37 V was then applied between the electrode of the plotter pen and the electrode of each sample, such that the samples were positively polarised. The electrolyte at the tip of the plotter pen was then brought into contact with each sample, and a line was plotted. The plotter speed used was 10 mm/second. Subsequently, both samples were rinsed with copious amounts of deionised water and dried at 60° C. for 15 min. When dried, a rectangle of 9×18 mm was cut across the deactivated line of each sample. Two silver electrodes were painted on each sample rectangle, one on each side of the deactivated line.

The widths of the deactivated lines were measured in a microscope: Sample A had a line width of 340 µm and sample B had a line width of 850 µm. The resistances over the deactivated lines was measured using a Hewlett Packard Multimeter and were found to be 120 MΩ for sample A and 50Ω for sample B.

Example 7

Patterning of PEDOT-PSS According to the Process of the Invention by Using a Pre-patterned Protective Layer on Top of the PEDOT-PSS Surface The surface conductivity of PEDOT-PSS before and after electrochemical deactivation was determined as follows: Two 7 cm×7 cm samples of PEDOT-PSS were cut from 1-2 µm thick EL350 Orgacon™ foil as provided by Agfa-Gaevert N.V. and designated sample A and sample B. Photoresist (Chipley SJR-1818 photoresist) was used to define a test pattern on the PEDOT-PSS surface. It was achieved by first spin coating the samples with photoresist and then exposing it with-UV light over the area to be opened. A developer (Chipley MF-319 photoresist developer) was used for developing the test pattern on the samples. The test pattern was chosen to be a set of 5 lines, 15 mm long with the line width of 60 µm, spaced by 3 mm.

A simple electrochemical cell was prepared with a counter electrode made of platinum inserted in electrolyte with 10% (weight) NaCl. Sample A was connected to the anode of a power supply that provided 50 V direct current. The cathode of the power supply was connected to the platinum counter electrode and the sample was inserted into the electrolyte with a constant velocity of about 3 cm/s. The distance between the counter electrode and the sample was held at a constant value of about 5 mm during the lowering of the sample as well as during the submerging of the sample. After 5 seconds, the power was switched off and sample A was lifted up from the electrolyte. Sample B was also inserted into the electrolyte but with no power connected to it. Subsequently, both samples were rinsed with copious amounts of deionised water, and dried at 60° C. for 15 min. A rectangle (4×15 mm) was cut out around one of the lines of each sample, symmetrical with about 2 mm of free space on each side of the respective line. Silver electrodes were painted on both sides of the deactivated line of each rectangle. The resistance over the line was measured to over 120 MΩ for sample A, i e the over-oxidised sample, while it was only 2 kΩ for sample B, i e the not over-oxidised sample. Sample B showed no change in resistivity due to the dipping in the electrolyte. The width of the deactivated line was measured to 60 µm for sample A, which is the same width as the opening in the photoresist

The invention claimed is:

1. A process for rendering an electrically conducting polymer essentially non-conducting, comprising:
   bringing said polymer into direct electrical contact with an electrolyte;
   applying an electric voltage to said polymer using a first and a second electrode connected to a voltage supply, wherein said first electrode is in direct electrical contact with one of said polymer and said electrolyte, and said second electrode is in direct electrical contact with said electrolyte; and
   rendering said electrically conducting polymer non-conducting in accordance with a predetermined pattern through electrochemical reactions occurring in the interface between said polymer and said electrolyte in response to said electric voltage by moving said polymer and said second electrode relative each other in accordance with said predetermined pattern.

2. A process according to claim 1, in which said polymer is present in the form of a film, and said rendering said electrically conducting polymer non-conducting in accordance with a predetermined pattern is realised while restricting the region in which electrochemical reactions occur in response to the applied voltage to part of the film.

3. A process according to claim 2, in which said rendering said electrically conducting polymer non-conducting in accordance with a predetermined pattern by restricting the region in which electrochemical reactions occur in response to the applied voltage to those parts of the film that correspond to said predetermined pattern.

4. A process according to claim 1, further involving the step of rendering the polymer surface hydrophobic prior to bringing said polymer into direct contact with electrolyte.

5. A process according to claim 1, in which said second electrode are in direct electrical contact with each other inside a container, which container comprises at least one opening through which said electrolyte may be brought into direct electrical contact with said polymer.

6. A process according to claim 5, in which said container has an opening with a cross-sectional area of from 100 µm to 5 cm.

7. A process according to claim 5, in which said container is a pen.

8. A process according to claim 7, in which said pen is the pen of a plotter tool.

9. A process according to claim 8, in which said predetermined pattern is applied using a plotter tool comprising said pen.

10. A process according to claim 9, in which the position of said pen is controlled by a computer.

11. A process according to claim 10, in which said computer comprises graphics software, and said predetermined pattern is designed using said graphics software.

12. A process according to claim 3, in which a printing method involving a rotating cylinder is used, which cylinder serves as said second electrode.

13. A process according to claim 12, in which said cylinder is made at least in part of a conducting material.

14. A process according to claim 12, in which the surface of said cylinder is partly covered with a layer of an insulating material, and in which the parts of said surface not covered by insulating material correspond to a mirror image of said predetermined pattern.

15. A process according to claim 14, in which the parts of said surface not covered by insulating material are covered by said electrolyte.

16. A process according to claim 3, in which a screen printing method is used.

17. A process according to claim 16, in which the screen printing squeegee corresponds to said second electrode, and in which said electrolyte is used as screen printing paste.

18. A process according to claim 16, in which the mesh of the screen printing screen is made of a conducting material and corresponds to said second electrode, and in which said electrolyte is used as screen printing paste.

19. A process according to claim 1, in which said electrically conducting polymer comprises a conjugated π-system.

20. A process according to claim 19, in which said polymer is rendered essentially non-conducting through interruption of said conjugated π-system, said interruption corresponding to over-oxidation of said polymer.

21. A process according to claim 1, in which said polymer is chosen from the group consisting of polythiophenes, polypyrroles, polyanilines, polyisothianaphtalenes, polyphenylene vinylenes and copolymers thereof.

22. A process according to claim 21, in which said polymer is a polymer or copolymer of a 3,4-dialkoxythiophene, in which said two alkoxy groups may be the same or different or together represent an optionally substituted oxy-alkylene-oxy bridge.

23. A process according to claim 22, in which said polymer or copolymer of a 3,4-dialkoxythiophene is selected from the group consisting of poly(3,4-methylene-dioxythiophene), poly(3,4-methylenedioxythiophene) derivatives, poly(3,4-ethylenedioxythiophene), poly(3,4-ethylenedioxythiophene) derivatives, poly(3,4-propylenedioxythiophene), poly(3,4-propylenedioxythiophene) derivatives, poly(3,4-butylenedioxythio-phene), poly(3,4-butylenedioxythiophene) derivatives, and copolymers therewith.

24. A process according to claim 23, in which said polymer is poly(3,4-ethylenedioxythiophene).

25. A process according to claim 1, in which said polymer comprises a polyanion compound.

26. A process according to claim 25, in which said polyanion compound is poly(styrene sulfonic acid) or a salt thereof.

27. A process according to claim 1, in which said electric voltage is in the range of from about 10 to about 100 V.

28. A process according to claim 27, in which said electric voltage is in the range of from about 25 to about 50 V.

29. A process according to claim 28, in which said electric voltage is about 25V.

30. A process according to claim 6, in which said container is a pen.

31. A process for rendering an electrically conducting polymer essentially non-conducting, comprising the steps of:
   applying a pre-patterned protective layer to the polymer, which layer is to protect areas of the polymer from electrolyte;
   bringing unprotected areas of said polymer into direct electrical contact with an electrolyte by applying a film of electrolyte to the polymer surface;
   applying an electric voltage to said polymer using at least two electrodes connected to a voltage supply, each electrode independently being in direct electrical contact with one of said polymer and said electrolyte; and
   rendering said electrically conducting polymer non-conducting through electrochemical reactions occurring in the interface between said polymer and said electrolyte in response to said electric voltage.

32. A process according to claim 2, in which said polymer is present in the form of a film, and said rendering said electrically conducting polymer non-conducting is realised while restricting the region in which electrochemical reactions occur in response to the applied voltage to part of the film.

33. A process according to claim 2, in which said rendering said electrically conducting polymer non-conducting occurs in a predetermined pattern, by restricting the region in which electrochemical reactions occur in response to the applied voltage to those parts of the film that correspond to said predetermined pattern.

\* \* \* \* \*